(12) United States Patent
Kuitani et al.

(10) Patent No.: US 8,241,929 B2
(45) Date of Patent: *Aug. 14, 2012

(54) CONTACTOR, CONTACT STRUCTURE, PROBE CARD, AND TEST APPARATUS

(75) Inventors: Tetsuya Kuitani, Tokyo (JP); Tadao Saito, Tokyo (JP); Yoshihiro Abe, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/325,799

(22) Filed: Dec. 14, 2011

(65) Prior Publication Data

US 2012/0112781 A1    May 10, 2012

Related U.S. Application Data

(60) Continuation of application No. 12/818,503, filed on Jun. 18, 2010, now Pat. No. 8,097,475, which is a division of application No. 11/426,090, filed on Jun. 23, 2006, now Pat. No. 7,764,152.

(30) Foreign Application Priority Data

Jun. 27, 2005 (WO) .................. PCT/JP2005/011748

(51) Int. Cl.
*H01L 21/66* (2006.01)
*H01H 67/02* (2006.01)

(52) U.S. Cl. .......................... 438/18; 335/126

(58) Field of Classification Search ............... 438/11–18; 335/78, 126; 257/48, 784
See application file for complete search history.

(56) References Cited

U.S. PATENT DOCUMENTS

| 5,670,889 | A | 9/1997 | Okubo et al. |
| 6,043,671 | A | 3/2000 | Mizuta |
| 6,232,669 | B1 | 5/2001 | Khoury et al. |
| 6,420,884 | B1 | 7/2002 | Khoury et al. |
| 6,535,003 | B2 | 3/2003 | Aldaz et al. |
| 6,586,956 | B2 | 7/2003 | Aldaz et al. |
| 6,677,771 | B2 | 1/2004 | Zhou et al. |
| 7,764,152 | B2 * | 7/2010 | Kuitani et al. ............. 335/126 |
| 2004/0040738 | A1 | 3/2004 | Tani et al. |
| 2004/0119485 | A1 | 6/2004 | Koch et al. |

FOREIGN PATENT DOCUMENTS

| JP | 11-145215 | 5/1999 |
| JP | 2000-249722 | 9/2000 |
| JP | 2000-292443 | 10/2000 |
| JP | 2001-159642 | 6/2001 |
| JP | 2004-087856 | 3/2004 |
| JP | 2004-205511 | 7/2004 |
| JP | 2005-518105 | 6/2005 |
| WO | 03/062837 | 7/2003 |
| WO | 03/071289 | 8/2003 |

* cited by examiner

*Primary Examiner* — Calvin Lee
(74) *Attorney, Agent, or Firm* — Greenblum & Bernstein, P.L.C.

(57) ABSTRACT

A contactor and an associated contact structure, probe card and test apparatus are provided. The contact may include a base part having three or more steps in a stairway state, a support part with a rear end side provided at the base part and a front end side sticking out from the base part, and a conductive part formed on a surface of the support part and electrically contacting a contact of a device under test.

11 Claims, 21 Drawing Sheets

US 8,241,929 B2

CONTACTOR, CONTACT STRUCTURE, PROBE CARD, AND TEST APPARATUS

CROSS-REFERENCE TO RELATED APPLICATIONS

This application is a continuation of application Ser. No. 12/818,503, filed Jun. 18, 2010 and issued as U.S. Pat. No. 8,097,475 on Jan. 17, 2012; which is a divisional of application Ser. No. 11/426,090, filed Jun. 23, 2006 and issued as U.S. Pat. No. 7,764,152 on Jul. 27, 2010; and which claims the benefit of International Application PCT/JP2005/011748, filed Jun. 27, 2005. The disclosures of application Ser. Nos. 12/818,503, 11/426,090 and PCT/JP2005/011748 are incorporated by reference herein in their entireties.

BACKGROUND OF THE INVENTION

1. Field of the Invention

The present invention relates to a contactor, a contact structure provided with contactors, a probe card, a test apparatus, a method of production of a contact structure, and a production apparatus of a contact structure for contacting pads, electrodes, leads, or other contacts provided on an integrated circuit or other electrical circuit (hereinafter also referred to representatively as an "IC") formed on a IC semiconductor wafer, semiconductor chip, semiconductor device package, printed circuit board, etc. to establish electric contact with the ICs when testing the ICs.

2. Description of the Related Art

A large number of semiconductor integrated circuit chips are formed on a silicon wafer etc., then are diced, wire bonded, packaged, and otherwise processed to produce finished electronic devices. These ICs are all tested for operation before shipment. This IC test is performed both in the finished product state and in the wafer state.

When testing ICs in the wafer state, as a probe for securing electric contact with a tested IC, there has been known one having a base part having inclinations at its two ends, a beam part with a rear end side provided at the base part and with a front end side sticking out from the base part, and a conductive part formed on the surface of the beam part (hereinafter referred to simply as a "silicon finger contactor") (for example, see Japanese Patent Publication (A) No. 2000-249722, Japanese Patent Publication (A) No. 2001-159642, and WO03/071289 pamphlet).

This silicon finger contactor is formed by for example photolithography or other semiconductor production technology from a silicon substrate. In particular, when forming the inclinations at the two ends of the base part, the silicon substrate is anistropically etched so as to form inclined surfaces of 54.7° dependent on the crystal plane of silicon. Further, these inclined surfaces are used to give a predetermined angle for the silicon finger contactor to be mounted on the probe board.

When using a probe card provided with such silicon finger contactors to test ICs, the probe card is brought close to the semiconductor wafer and the silicon finger contactors are brought into contact with the pads of the tested ICs. Further, the silicon finger contactors are made to move further toward the pads (overdriven) so that the front ends of the silicon finger contactors scrub the pads so as to remove the aluminum oxide layers formed on the pads and thereby establish electric contact with the tested ICs.

At the time of contact of the silicon finger contactors and pads, variations of the silicon finger contactors in the height direction cause certain silicon finger contactors on the probe board to contact the pads of the ICs first, then the first contacting silicon finger contactors are excessively overdriven until all of the silicon finger contactors provided on the probe board contact the pads of the ICs.

Here, the angles of inclination formed at the base parts of the silicon finger contactors are relatively sharp angles of 54.7° as explained above, so the amount of scrubbing of the silicon finger contactors with respect to the amount of overdrive of the silicon finger contactors first contacting the pads become large (that is, the amount of scrubbing/amount of overdrive becomes large). For that reason, for example, if the size of the pads of the ICs become small, the front ends of the silicon finger contactors end up sticking out from the pads or deforming or becoming damaged.

SUMMARY OF THE INVENTION

An object of the present invention is to provide a contactor, a contact structure provided with the contactors, a probe card, a test apparatus, a method of production of a contact structure, and a production apparatus of a contact structure able to prevent mistaken contact with contacts.

(1) To achieve the above object, according to the present invention, there is provided a contactor for establishing electric contact with a device under test when testing the device under test by means of contacting a contact provided at the device under test, having a base part formed with a step difference, a support part with a rear end side provided at the base part and a front end side sticking out from the base part, and a conductive part formed at the surface of the support part and electrically contacting the contact, wherein an angle part of the step difference formed at the base part contacts the surface of a contact board mounting the contactor so as to thereby define a predetermined inclination angle between the surface of the contact board and the support part (see claim 1).

In the present invention, the base part of the contactor is formed with a step difference, and this step difference is utilized to mount the contactor on the contact board in an inclined state. Due to this, it is possible to control the ratio of the length and depth of the step difference so as to mount the contactor on the contact board at a desired angle, so for example even if an IC pad is small in size, mistaken contact with the pad can be prevented.

Note that in the present invention, the "rear end side" in the contactor means the side contacting the contact board. As opposed to this, the "front end side" in the contactor means the side contacting the contact of the device under test.

While not particularly limited in the above invention, preferably the step difference has a shape with a height of the rear end side of the base part relatively lower than a height of the front end side.

While not particularly limited in the above invention, preferably the base part is formed with a plurality of step differences in a stairway state (see claim 2).

Due to this, the support points of the contactor mounted on the contact board increase, so the stability of attachment of the contactor with respect to the contact board is improved.

While not particularly limited in the above invention, preferably the support part has an insulation layer at the surface on the side where the conductive part is formed (see claim 3). The insulation layer is preferably comprised of $SiO_2$ (see claim 9).

(2) To achieve the above object, according to the present invention, there is provided a contact structure provided with a plurality of contactors as set forth in any of the above and a contact board mounting the plurality of contactors on its surface, wherein each of the contactors has a plurality of the support parts, and the plurality of support parts are arranged on a single base part at predetermined intervals (see claim 5).

While not particularly limited in the above invention, preferably the contactors are bonded to the contact board using an ultraviolet curing type adhesive, temperature curing type adhesive, or thermoplastic adhesive (see claim 6).

While not particularly limited in the above invention, preferably the contact board is provided on its surface with a plurality of connection traces and the connection traces are electrically connected to corresponding conductive parts of the contactors (see claim 7).

While not particularly limited in the above invention, preferably the connection traces provided on the contact board and the conductive parts of the contactors are connected by bonding wires (see claim 8).

(3) To achieve the above object, according to the present invention, there is provided a contact structure as set forth in any one of the above, wherein the devices under test are electrical circuits formed on a semiconductor wafer, and the contact board has a heat expansion coefficient ($\alpha 1$) satisfying the following equation (1) (see claim 9).

$$\alpha 1 = \alpha 2 \times \Delta t 2 / \Delta t 1 \qquad (1)$$

where, in the above equation (1), $\alpha 1$ is a heat expansion coefficient of the contact board, $\Delta t1$ is a rising temperature of the contact board at the time of a test, $\alpha 2$ is a heat expansion coefficient of the semiconductor wafer, and $\Delta t2$ is a rising temperature of the semiconductor wafer at the time of the test.

In the present invention, since the contact board is designed to satisfy the above equation (1), a distance not affecting the impedance is secured between the contact structure and semiconductor wafer and the amounts of expansion of the contact board and semiconductor wafer at the high temperature state are matched.

Due to this, the difference between the amount of heat expansion of the contact board and the amount of heat expansion of the semiconductor wafer at the high temperature state can be made smaller and mistaken contact with pads or other contacts can be prevented. Further, since the difference of the amounts of heat expansion is made smaller, a wider range of the semiconductor wafer can be simultaneously tested and a greater number of simultaneous measurements can be secured.

While not particularly limited in the above invention, preferably the contact board is provided with a core part having a core insulation layer containing a carbon fiber material, at least one first multilayer interconnect part having a first insulation layer containing a glass cloth and first interconnect patterns and laminated on the core part, and at least one second multilayer interconnect part having a second insulation layer and second interconnect patterns and laminated on the first multilayer interconnect part (see claim 11).

Due to this, the heat expansion of the contact board can be kept low, so the difference between the amount of heat expansion of the contact board and the amount of heat expansion of the semiconductor wafer at the high temperature state can be made small.

While not particularly limited in the above invention, preferably the second multilayer interconnect part is a builtup layer (see claim 12).

(4) To achieve the above object, according to the present invention, there is provided a test apparatus provided with a test head on which a contact structure as set forth in any of the above is mounted and a tester for testing devices under test through the test head (see claim 14).

While not particularly limited in the above invention, preferably the devices under test are electrical circuits formed on a semiconductor wafer, and the contact structure is mounted on the test head so that a probe height plane formed by the front ends of the plurality of contactors is substantially parallel with the surface of the semiconductor wafer (see claim 15).

Due to this, variation of the contactors mounted on the contact board in the height direction can be suppressed.

(5) To achieve the above object, according to the present invention, there is provided a method of production of a contact structure for establishing electric contact with devices under test when testing such devices under test, comprising a feed step of feeding an SOI wafer, a base part formation step of forming etching mask patterns on the bottom surface of the SOI wafer and etching the bottom surface to form base parts of contactors having step differences, a support part formation step of forming etching mask patterns on the top surface of the SOI wafer, etching the top surface, forming etching mask patterns on the bottom surface of the SOI wafer, etching said bottom surface and removing an $SiO_2$ layer of the SOI wafer to thereby form support parts of the contactors, a conductive part formation step of covering a top surface of the support parts by a conductive material so as to form conductive parts of the contactors, and a mounting step of mounting the contactors on a contact board so that angle parts of the step differences formed on the base parts contact the surface of the contact board (claim 16).

While not particularly limited in the above invention, preferably the top surface of the SOI wafer is etched, then an $SiO_2$ layer forming an insulation layer is formed on the top surface of the SOI wafer in the support part formation step and the surface of the insulation layer is covered with a conductive material in the conductive part formation step (see claim 17).

While not particularly limited in the above invention, preferably deep reactive ion etching (DRIE) is used to etch the bottom surface of the SOI wafer in the base part formation step and DRIE is used to etch the top surface of the SOI wafer in the support part formation step (see claim 18).

While not particularly limited in the above invention, preferably the SOI wafer is a two-layer SOI wafer having two Si layers and one $SiO_2$ layer sandwiched between the two Si layers, and an etching time is controlled to form the base parts with the step differences in the base part formation step (see claim 19).

While not particularly limited in the above invention, preferably the SOI wafer is a three-layer SOI wafer having three Si layers and two $SiO_2$ layers sandwiched between each two of the three Si layers, the $SiO_2$ layer at the bottom side is used as an etching stopper in the base part formation step, and the two $SiO_2$ layers are removed in the support part formation step (see claim 20).

While not particularly limited in the above invention, preferably the mounting step has an arrangement step of bonding the base parts on the surface of the contact board by a adhesive to arrange the contactors on the contact board at predetermined inclinations and a connection step of connecting connection traces provided on the contact board with the contactors (see claim 21).

While not particularly limited in the above invention, preferably the connection traces provided on the contact board and the conductive parts of the contactors are connected by bonding wires in the connection step (see claim 22).

(6) To achieve the above object, according to the present invention, there is provided a production apparatus of a contact structure producing a contact structure for establishing electric contact with devices under test when testing the devices under test, comprising a coating means for coating a adhesive at a predetermined position of a contact board, a suction means for holding a contactor by suction, and a moving means for making the contact board move relative to the contactor, the suction means having a suction surface for contacting the contactor and applying suction, the suction surface being provided with a limiting means for limiting fine movement of the contactor relative to the suction surface (see claim 23).

In the present invention, a limiting means is provided for limiting fine movement of the contactor at the suction surface of the suction means mounting a contactor at a predetermined position coated with a adhesive on the contact board. Due to this, a contactor can be positioned at and bonded to a predetermined position on the contact board with a high precision, so mistaken contact at the time of a test can be prevented.

While not particularly limited in the above invention, preferably the suction surface is an inclined surface having an inclination angle substantially the same as the attachment angle of the contactor with respect to the contact board (see claim 24). Further, preferably the limiting means include a step difference formed on the suction surface (see claim 25). Further, preferably a rear end of said contactor engaged with the step difference (see claim 26).

While not particularly limited in the above invention, preferably the apparatus is further provided with a detecting means for detecting a relative position of the contactor with respect to the contact board, and the moving means makes the contactor move so that the contactor do not press against the contact board based on the results of detection of the detecting means (see claim 27).

Due to this, when the suction means move the contactor and places it on the contact board, the contactor can be prevented from pressing against the contact board and the contactor can be prevented from finely moving and deviating from the suction surface of the suction means.

(7) To achieve the above object, according to the present invention, there is provided a probe card for establishing electric contact with devices under test when testing such devices under test, provided with a contactor for contacting a plurality of pads provided at the devices under test and a contact board mounting the contactor on its surface, the contactor having a predetermined plurality of elastically deformable long support parts forming a group, and a single base part on which the group of support parts are provided, a rear end side of the base part being formed with a step difference defining a predetermined inclination angle of the support parts with respect to the contact board, the base part being bonded to the contact board at the rear end side so that the array of the group of support parts corresponds to the array of the plurality of pads (see claim 28).

While not particularly limited in the above invention, preferably the contactor has conductive parts formed on at least one side surface of the support parts and electrically contacting the pads at those front end parts, the contact board is provided on its surface with connection traces, and the conductive parts and the connection traces are electrically connected by bonding wires (see claim 29).

While not particularly limited in the above invention, preferably the contact board is comprised of a board material having a heat expansion corresponding to the heat expansion of a semiconductor wafer formed with said device under test (see claim 30).

(8) To achieve the above object, according to the present invention, there is provided a test apparatus provided with a probe card as set forth in any of the above, a test head on which the probe card is mounted, and a tester for testing the device under test through the test head (see claim 31).

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Below, embodiments of the present invention will be described based on the drawings.

Figure 1:
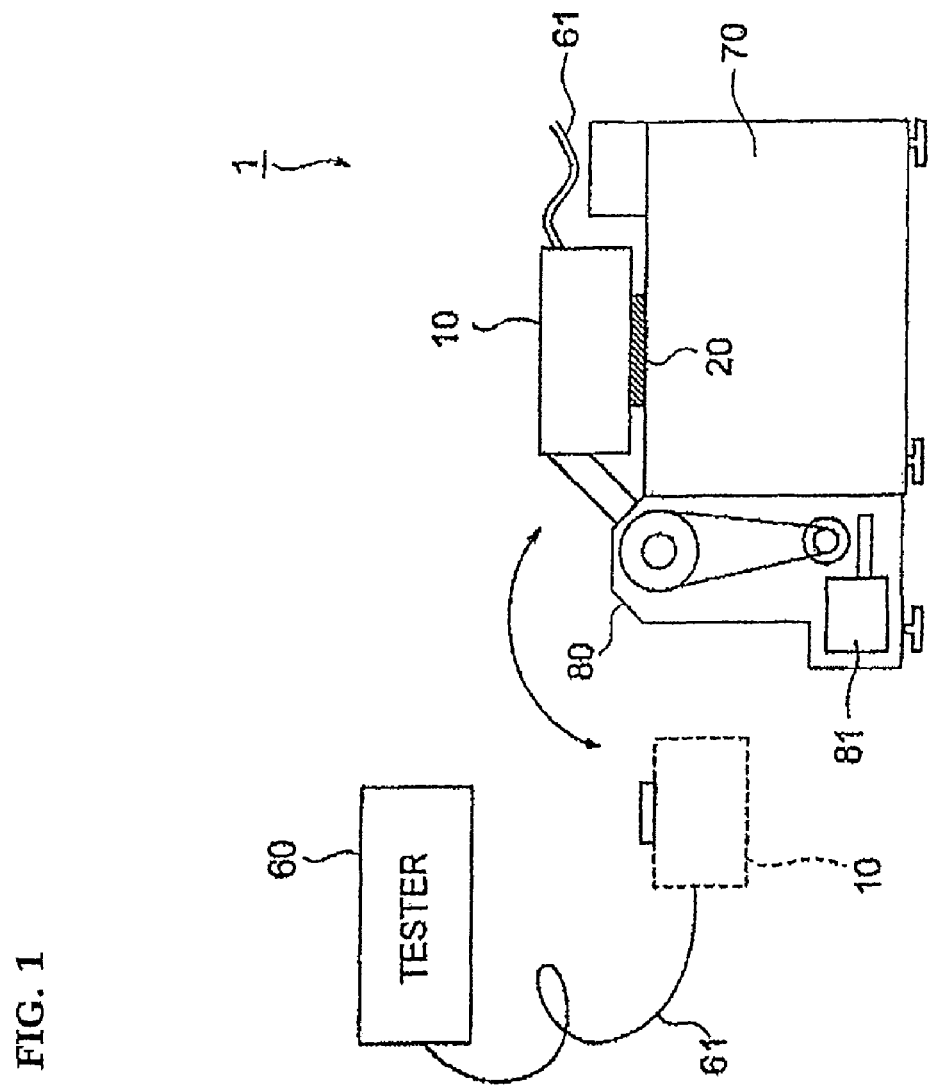
FIG. 1 is a schematic view of a test apparatus according to the first embodiment of the present invention.
Figure 2:
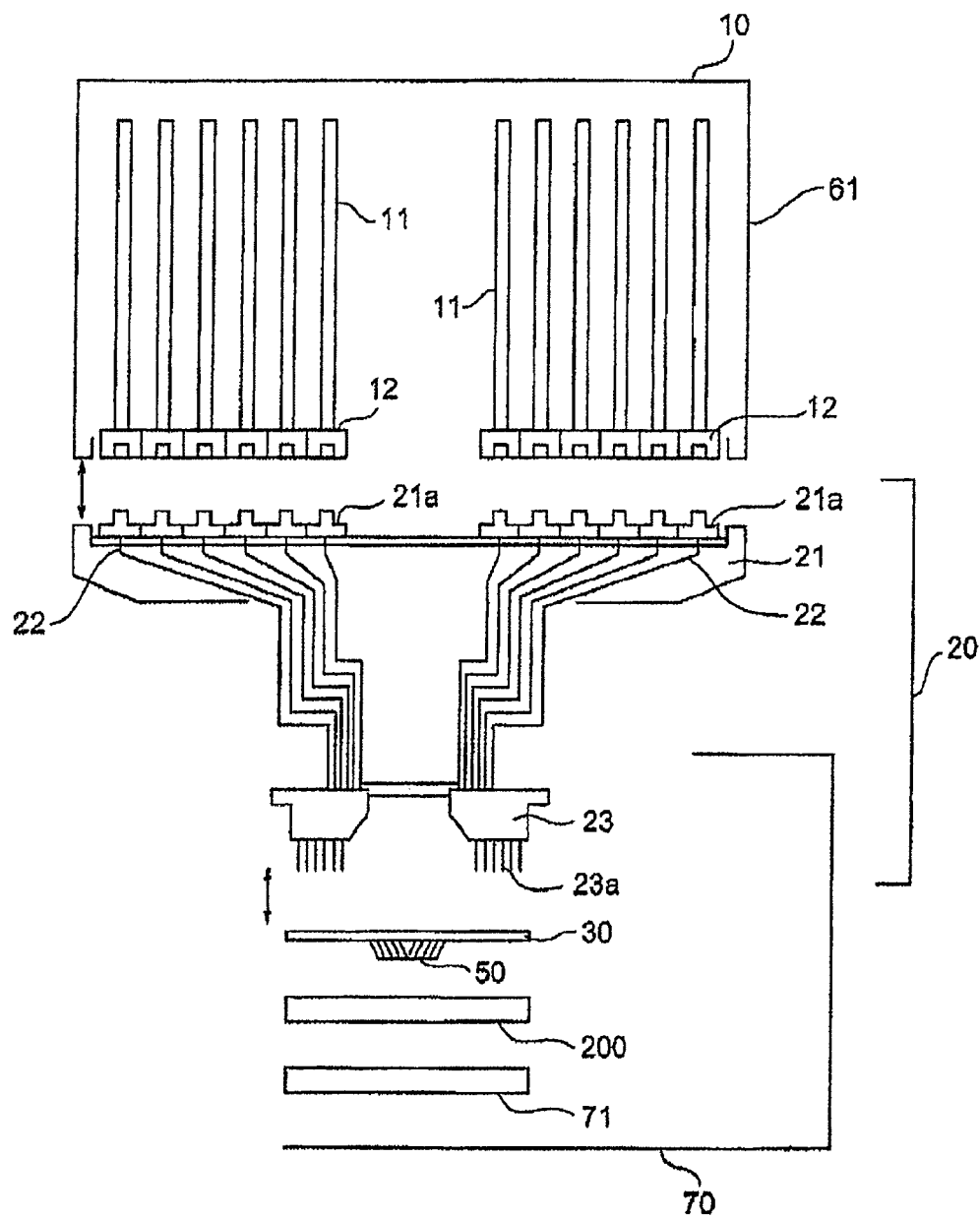
FIG. 2 is a conceptual view of the connection relationship of a test head and probe card used in the test apparatus of FIG. 1.

FIG. 1 is a schematic view of a test apparatus according to the first embodiment of the present invention; while FIG. 2 is a conceptual view of the connection relationship of a test head and probe card used in the test apparatus of FIG. 1.

The test apparatus 1 according to the present embodiment, as shown in FIG. 1, is provided with a tester 60 (test apparatus body) having a test head 10 and a wafer prober 70. The test head 10 is connected through a cable bundle 61 to the tester 60. The test head 10 and wafer prober 70 are, for example, mechanically positioned and mechanically and electrically connected by a manipulator 80 and drive motor 81. The tested semiconductor wafer 200 is automatically fed by the wafer prober 70 to a test position on the test head 10.

On the test head 10, the tested semiconductor wafer 200 receives a test signal issued by the tester 60. Further, an output signal with respect to that test signal is sent from each IC of the tested semiconductor wafer 200 to the tester 60 where it is compared with the expected value to verify that the IC on the tested semiconductor wafer 200 is functioning normally.

In FIG. 1 and FIG. 2, the test head 10 and the wafer prober 70 are connected via an interface part 20. The interface part 20 is comprised of a relay board 21, coaxial cables 22, and a frog ring 23. The test head 10 is provided with a large number of printed circuit boards 11 corresponding to the test channels. This large number of printed circuit boards 11 corresponds to the number of test channels of the tester 60. These printed circuit boards 11 have connectors 12 for connecting with the corresponding contact terminals 21a on the relay board 21. Further, for accurate determination of the contact positions with respect to the wafer prober 70, a frog ring 23 is provided on the relay board 21. The frog ring 23 has a large number of ZIF connectors, pogo pins, or other connection pins 23a. These connection pins 23a are connected via the coaxial cables 22 to the contact terminals 21a on the relay board 21.

Further, as shown in FIG. 2, the test head 10 is arranged on the wafer prober 70 and mechanically and electrically connected via an interface part 20 to the wafer prober 70. In the wafer prober 70, the tested semiconductor wafer 200 is held on a chuck 71. A probe card 30 is provided above the tested semiconductor wafer 200. The probe card 30 has a large number of silicon finger contactors 50 for contacting the pads 210 of the ICs on the tested semiconductor wafer 200 at the time of a test (see FIG. 3).

The connection terminals of the probe card 30 (not shown) are electrically connected to the connection pins 23a provided on the frog ring 23. These connection pins 23a are connected to the contact terminals 21a of the relay board 21, while the contact terminals 21a are connected via the coaxial cables 22 to the printed circuit boards 11 of the test head 10. Further, the printed circuit boards 11 are, for example, connected through the cable bundle 61 having several hundred internal cables to the tester 60.

In the above configured test apparatus 1, the silicon finger contactors 50 contact the surface of the semiconductor wafer 200 on the chuck 71, supply test signals to the semiconductor wafer 200, and receive output signals from the semiconductor wafer 200. The output signals (response signals) from the tested semiconductor wafer 200 are compared with the expected values at the tester 60 whereby whether the ICs on the semiconductor wafer 200 are functioning normally is verified.

Figure 3:
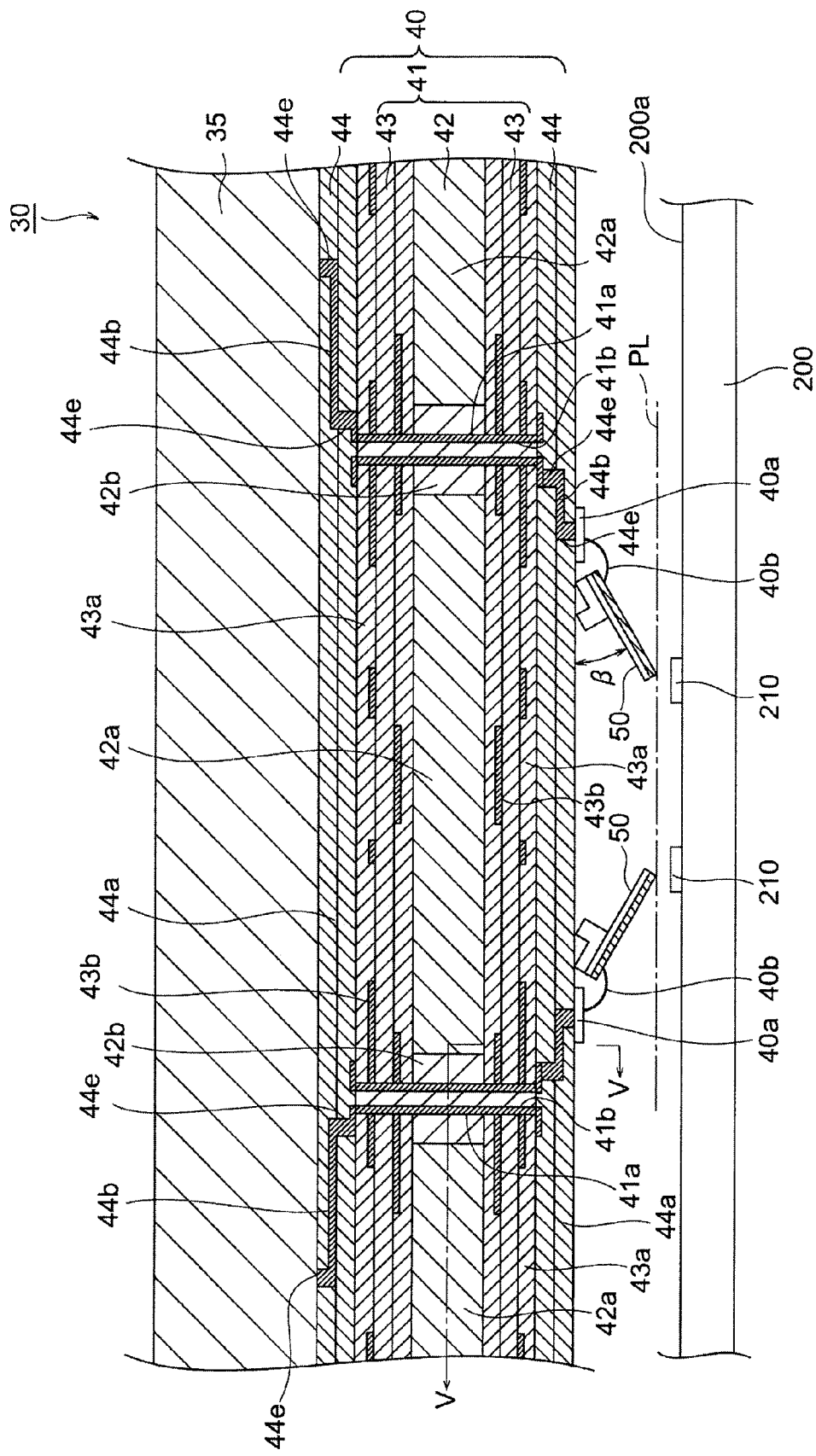
FIG. 3 is a cross-sectional view of a probe card according to the first embodiment of the present invention.
Figure 4:
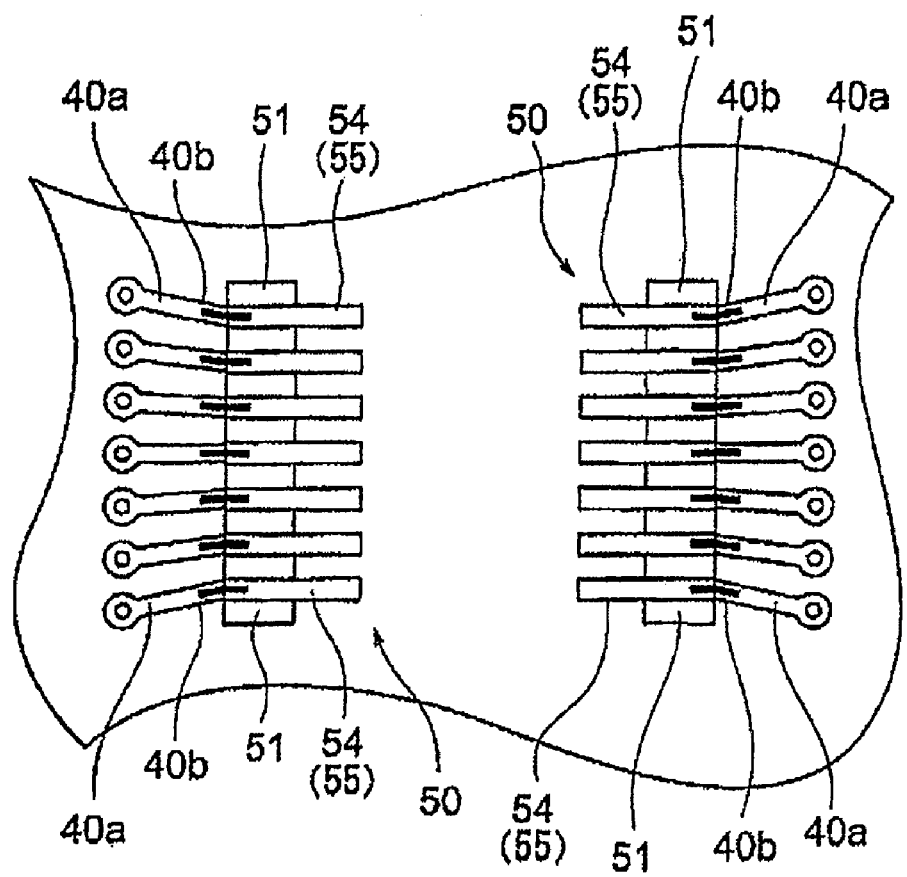
FIG. 4 is a partial bottom view of the probe card shown in FIG. 3.
Figure 5:
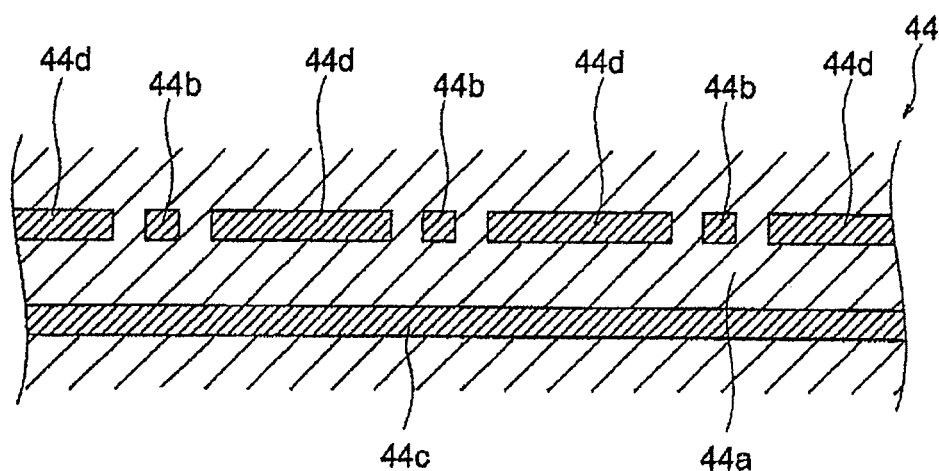
FIG. 5 is a partial cross-sectional view along the line V-V of FIG. 3.
Figure 6:
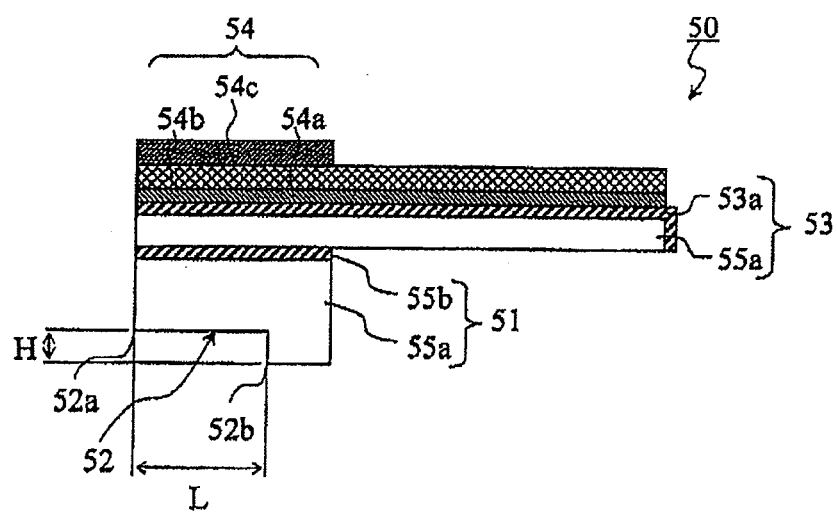
FIG. 6 is a cross-sectional view of a silicon finger contactor in the first embodiment of the present invention.
Figure 7:
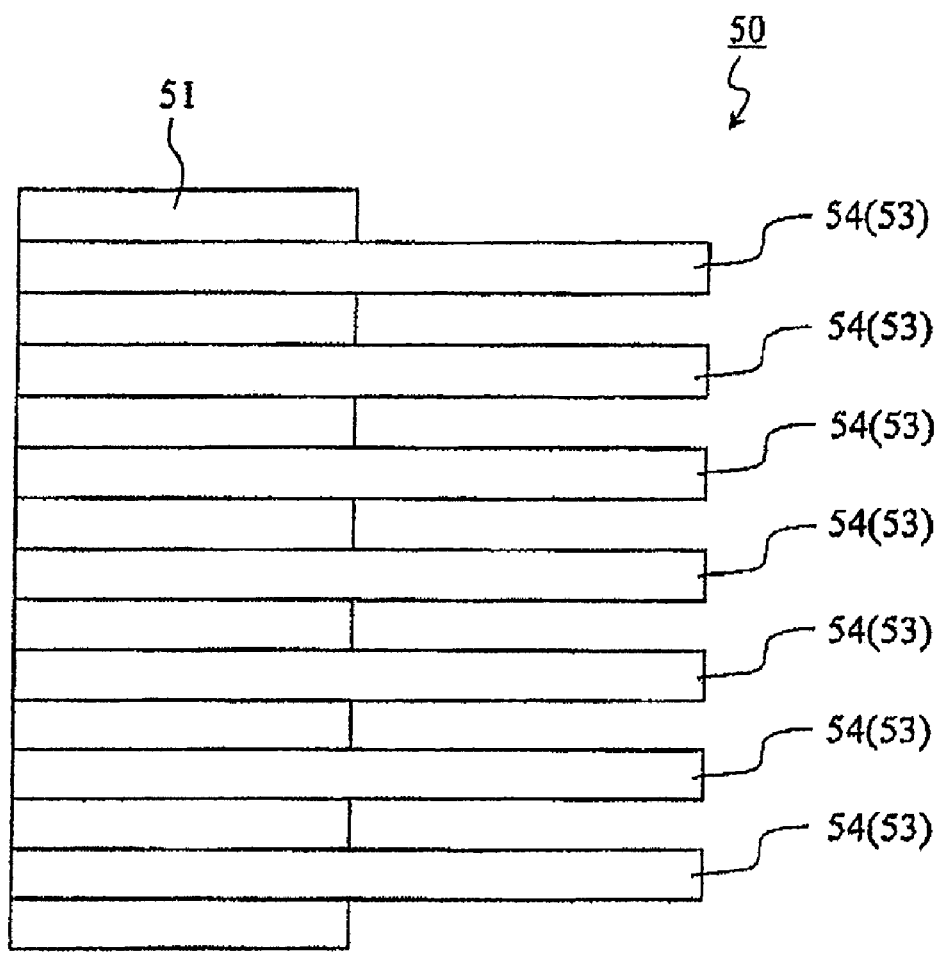
FIG. 7 is a plan view of the silicon finger contactor shown in FIG. 6.
Figure 8:
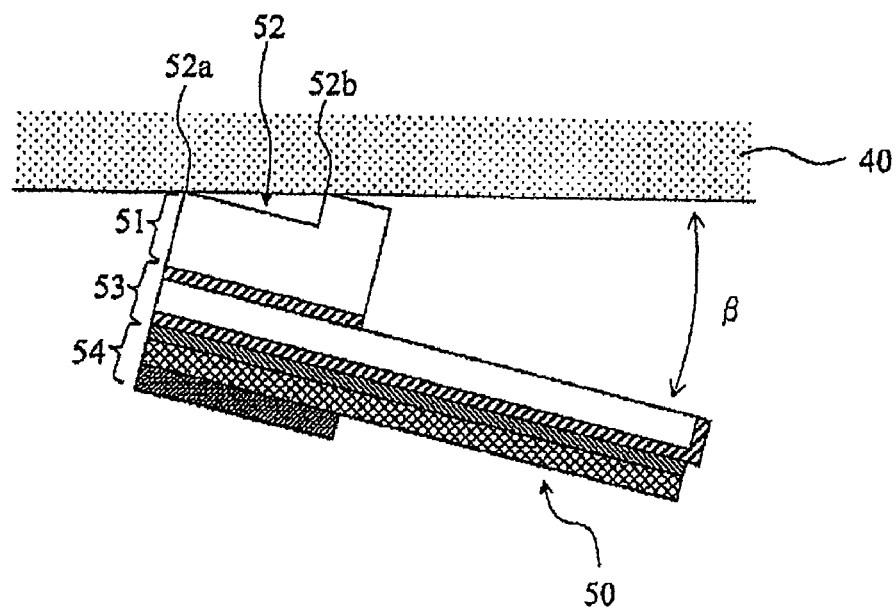
FIG. 8 is a view of the state of the silicon finger contactor shown in FIG. 6 mounted on a probe board.

FIG. 3 is a cross-sectional view of a probe card according to the first embodiment of the present invention; FIG. 4 is a partial bottom view of the probe card shown in FIG. 3; FIG. 5 is a partial cross-sectional view along the line V-V of FIG. 3; FIG. 6 is a cross-sectional view of a silicon finger contactor in the first embodiment of the present invention; FIG. 7 is a plan view of the silicon finger contactor shown in FIG. 6; and FIG. 8 is a view of the state of the silicon finger contactor shown in FIG. 6 mounted on a probe board.

The probe card according to the first embodiment of the present invention 30, as shown in FIG. 3, is provided with a probe board 40 made of a multilayer wiring board, a plurality of silicon finger contactors 50 mounted on the bottom surface of the probe board 40, and a stiffener 35 with the probe board 40 attached to the bottom.

First, the probe board 40 forming part of the probe card 30 will be explained.

The probe board 40 the present embodiment, as shown in the same figure, is provided with a base board 41 having a multilayer structure comprised of a core part 42 and multilayer interconnect parts 43, and builtup parts 44 formed laminated on the two surfaces of the base board 41. The base board 41 is formed with through hole vias 41a extending in that thickness direction.

The core part 42 is made from a sheet of carbon fiber reinforced plastic (CFRP) and has a CFRP part 42a and insulating plastic parts 42b. The CFRP part 42a is comprised of a carbon fiber material and a plastic material containing this and hardened.

The carbon fiber material is a carbon fiber cloth woven from carbon fiber yarn comprised of bundles of carbon fibers and is oriented laid out in the planar direction of spread of the core part 42. A plurality of the thus configured carbon fiber materials are stacked in the thickness direction and embedded in a plastic material. Note that as the carbon fiber material, instead of carbon fiber cloth, carbon fiber mesh or a carbon fiber nonwoven fabric may also be used.

As the plastic material containing the carbon fiber material, for example, polysulfone, polyether sulfone, polyphenyl sulfone, polyphthalamide, polyamidimide, polyketone, polyacetal, polyimide, polycarbonate, modified polyphenylene ether, polyphenylene oxide, polybutylene terephthalate, polyacrylate, polysulfone, polyphenylene sulfide, polyether ether ketone, tetrafluoroethylene, epoxy, cyanate ester, bis-maleimide, etc. may be mentioned.

The insulating plastic parts 42b are for securing electrical insulation between the carbon fiber materials of the CFRP parts 42a and the through hole vias 41a. As the material forming the insulating plastic parts 42a, for example, polysulfone, polyether sulfone, or another of the above plastic materials may be mentioned.

The multilayer interconnect parts 43 are members in which wirings are stacked in multiple layers by the so-called package lamination method and have multilayer structures of insulation layers 42a and interconnect patterns 42b. Each insulation layer 42a is formed using a prepreg comprised of glass cloth impregnated with a plastic material which is then cured. As the plastic material forming the insulation layers 42a, for example, polysulfone, polyether sulfone, or another of the above-mentioned plastic materials may be mentioned. The interconnect patterns 42b are made of for example copper and have their respective desired shapes. The interconnect patterns 42b are mutually electrically connected through the through hole vias 41a.

The builtup parts 44 are parts comprised of multiple layers of interconnects formed by the so-called buildup method and have multilayer structures of the insulation layers 44a and interconnect patterns 44b. Each insulation layer 44a is for example made of polysulfone, polyether sulfone, or another of the above-mentioned plastic materials. The interconnect patterns 44b are made of for example copper and have their respective desired shapes. The interconnect patterns 44b are mutually electrically connected through the through hole vias 44e. The topmost interconnect patterns 44b of the builtup parts 44 are formed with connection terminals (not shown) to which the connection pins 23a of the frog ring 23 are connected.

Each builtup part 44, as shown in FIG. 5, is formed with a ground pattern 44c at a layer different from the interconnect patterns 44b. In the present embodiment, in addition to this, grounded dummy ground patterns 44d are formed between the interconnect patterns 44b. Due to this, the pattern density of the inside layers of the probe board 40 can be made uniform, and variations in thickness, warping, etc. of the probe board 40 can be prevented. Note that FIG. 3 does not show the ground pattern 44c or the dummy ground patterns 44d.

The through hole vias 41a are for mutually electrically connecting the interconnect structures provided at the two sides of the baseboard 41, that is, the interconnect structures of the interconnect patterns 43b of the multilayer interconnect parts 43 and the interconnect patterns 44b of the builtup parts 44. The through hole vies 41a are formed by copper plating the inner circumferential surfaces of the through holes 41b formed passing through the base board 41. Note that instead of this copper plating or in addition to this copper plating, conductive paste containing silver powder or copper powder may also be filled in the through holes 41b to form the through hole vies. Note that as the through hole vias 41a, surface via hole (SVH) types may also be used in addition to through types.

In the present embodiment, as shown in FIG. 3, at the outer sides of the core part 42, two multilayer interconnect parts 20 are laminated facing each other. Further, at the outsides of the two multi layer interconnect parts 43, two builtup parts 44 are laminated facing each other, whereby a probe board 40 is formed.

By making the layer configuration of the probe board 40 symmetrical in the vertical direction, the warping of the probe board 40 itself can be reduced.

Further, the probe board 40 in the present embodiment has a heat expansion coefficient ($\alpha 1$) satisfying the following equation (1):

$$\alpha 1 = \alpha 2 \times \Delta t2 / \Delta t1 \qquad \text{equation (1)}$$

where, in the above equation (1), $\alpha 1$ is a heat expansion coefficient of the probe board 40, $\Delta t1$ is a rising temperature of the probe board 40 at the time of a test, $\alpha 2$ is a heat expansion coefficient of the tested semiconductor wafer 300, and $\Delta t2$ is a rising temperature of semiconductor wafer 300 at the time of the test. Note that $\Delta t1$ and $\Delta t2$ satisfy the following equations (2) and (3).

$$\Delta t1 = T1 - Tr \qquad \text{equation (2)}$$

$$\Delta t2 = T2 - Tr \qquad \text{equation (3)}$$

where, in the above equations (2) and (3), T1 is the temperature of the probe board 40 at the time of the test (test temperature setting), T2 is the temperature of the tested semiconductor wafer 200 at the time of the test, and Tr is room temperature. Note that T2 is determined by the heat radiated from the tested semiconductor wafer 200 and the heat conducted from the silicon finger contactors 50, so can be calculated based on the number of the silicon finger contactors 50 mounted on the probe board 40.

By the probe board 40 having the heat expansion coefficient satisfying the above equation (1), the amounts of expansion of the probe board 30 and the tested semiconductor wafer 200 in the high temperature state can be matched. As a result, the difference between the amount of heat expansion of the probe board 40 and the amount of heat expansion of the tested semiconductor wafer 200 in the high temperature state can be reduced. Therefore, the positional deviation between the silicon finger contactors 50 and pads of the ICs is greatly reduced and as a result mistaken contact is prevented. Further, by making the difference of the amounts of heat expansion smaller, the silicon finger contactors 50 can be arranged for a wide range of the tested semiconductor wafer 200 and a large number of ICs can be simultaneously tested, so a greater number of simultaneous measurements can be secured.

Next, the silicon finger contactors 50 of the probe card 30 will be explained.

Each silicon finger contactor 50 in the present embodiment, as shown in FIG. 6, has a base part 51 formed with a step difference 52, a support part 53 with a rear end side provided at the base part 51 and a front end side sticking out from the base part 51, and a conductive part 54 formed on the surface of the support part 53.

Note that in the present embodiment, the "rear end side" in a silicon finger contactor 50 indicates the side contacting the probe board 40 (left side in FIG. 6). As opposed to this, the "front end side" in the silicon finger contactor 50 indicates the side contacting a pad 210 of an IC formed at the tested semiconductor wafer 200 (right side in FIG. 6).

This silicon finger contactor 50, as explained later, is produced from a silicon substrate by photolithography or other semiconductor production technology. As shown in FIG. 7, a single base part 51 is provided with a plurality of support parts 53 in finger shapes (a comb shape). By arranging the support parts 53 spaced from each other in this way, the support parts 53 can operate independently from each other. Further, since a single base part 51 has a plurality of support parts 53 fastened to it, even narrow pitch IC pads can be easily fabricated and handling as a unit module is possible. Therefore, mounting on a probe card becomes easy and accurate positioning becomes easy.

Further, by using semiconductor production technology to produce the contactors 50, the pitch of the plurality of support parts 53 can be easily made the same as the pitch of the pads 210 of the tested semiconductor wafer 200.

Further, semiconductor production technology may be used to make the contactors 50 small in size, so a probe card with a good quality of waveform in a frequency range of operation of the probe card 30 of 500 MHz or more can be realized.

Further, due to the smaller size of the contactors 50, the number of contactors mounted on a probe card 30 can be increased to for example 2000 or more and the number of simultaneous measurements can be increased.

The step difference 52 formed at the base part of a silicon finger contactor 50, as shown in FIG. 6, has a shape with the height of the rear end side made relatively lower than the height of the front end side at the base part 51. This step difference 52 has the depth H and length L.

Each of the support parts 53 is formed on it with an insulation layer 53a for electrically insulating the conductive layer 54 from the other parts of the silicon finger contactor 50. This insulation layer 53a is, for example, comprised of an SiO$_2$ layer or a boron-doped layer.

The surface of each insulation layer 53a is formed with a conductive part 54. The material forming the conductive part 54 may be nickel, aluminum, copper, gold, nickel cobalt, nickel palladium, rhodium, nickel gold, iridium, or other depositable materials. Note that the front end of the conductive part 54 is preferably made a sharp shape. Due to this, the scrubbing effect at the time of contact of the silicon finger contactors 50 and the pads 210 can be enhanced. The above configured silicon finger contactors 50, as shown in FIG. 3, are mounted on the probe board 40 so as to face the pads 210 of the ICs formed on the tested semiconductor wafer 200. Note that FIG. 3 only shows two silicon finger contactors 50, but in actuality a large number of silicon finger contactors 50 are arranged on the probe board 40.

Each silicon finger contactor 50, as shown in FIG. 8, is bonded to the probe board 40 so that the angle parts 52a, 52b of the step difference 52 formed on the base part 51 contact the surface of the probe board 40. As the adhesive for bonding a silicon finger contactor 50 and probe board 40, for example, an ultraviolet curing type adhesive, temperature curing type adhesive, thermoplastic adhesive, etc. may be mentioned. Note that the base part 51 is wide in area, so a sufficient bond strength is obtained.

In the present embodiment, the step difference 52 formed on the base part 51 is used to mount the silicon finger contactor 50 on the probe board 40, so the silicon finger contactor 50 is inclined with respect to the probe board 40 by an angle β corresponding to the ratio of the depth H and length L of the step difference 52.

That is, in the probe card 30 according to the present embodiment, by controlling the ratio of the depth H and length L of the step difference 52, a silicon finger contactor 50 can be easily mounted on the probe board 40 by a desired accurate angle β of for example 54.7° or less. Due to this, the ratio of the amount of scrubbing with respect to the amount of overdrive of the first contacting silicon finger contactors 50 (amount of scrubbing/amount of overdrive) can be reduced, so even if the pads 210 of the tested semiconductor wafer 200 are made small in size, mistaken contact with the pads 210 can be prevented.

Note that the inclination angle β of a silicon finger contactor 50 with respect to the probe board 40 is preferably as small as possible, but if this angle β is too low, the contactor is liable to abut against a capacitor etc. provided on the probe board 40.

As shown in FIG. 3 and FIG. 4, the bottom surface of the probe board 40 is provided with connection traces 40a. The connection traces 40a are electrically connected through the bonding wires 40b to the conductive parts 54 of the silicon finger contactors 50. Further, the connection traces 40a are electrically connected to vias 44e provided at the bottom most layer of the bottom builtup part 44 of the probe board 40. Note that instead of the bonding wires 40b, solder balls may also be used to electrically connect the connection traces 40e and conductive parts 44.

As shown in FIG. 3, the probe board 40 on which the silicon finger contactors 50 are attached is attached to a stiffener 35. At this time, shims etc. are inserted between the probe board 40 and stiffener 35 to adjust the probe height plane PL formed by the front ends of all of the silicon finger contactors 50 mounted on the probe board 40 to become substantially parallel to the surface of the tested semiconductor wafer 200 and then the probe board 40 is attached to the stiffener 35. Due to this, variation of the silicon finger contactors 50 mounted on the probe board 40 in the height direction can be suppressed.

In the test using the above configured probe card 30, when the tested semiconductor wafer 200 moves over the probe card 30, the silicon finger contactors 50 on the probe board 40 and the pads 210 on the tested semiconductor wafer 200 are mutually mechanically and electrically connected. As a result, signal paths are formed from the pads 210 to the connection terminals (not shown) formed at the topmost positions of the probe board 40. Note that the narrow pitches of the silicon finger contactors 50 are fanned out to large distances through the connection traces 40a and interconnect patterns 43b, 44b of the probe board 40.

When the silicon finger contactors 50 contact the pads 210, since the silicon finger contactor 50 are mounted on the probe board 40 inclined, the long support parts 53 elastically deform. Due to this elastic deformation, the front ends of the conductive parts 54 scrub the metal oxide films formed on the surfaces of the pads 210, whereby electric contact between the silicon finger contactors 50 and pads 210 is established. Here, the length, width, and thickness of the support parts 53 are determined based on the required pressing force to the pads 210 and the required amounts of elastic deformation.

Figure 9:
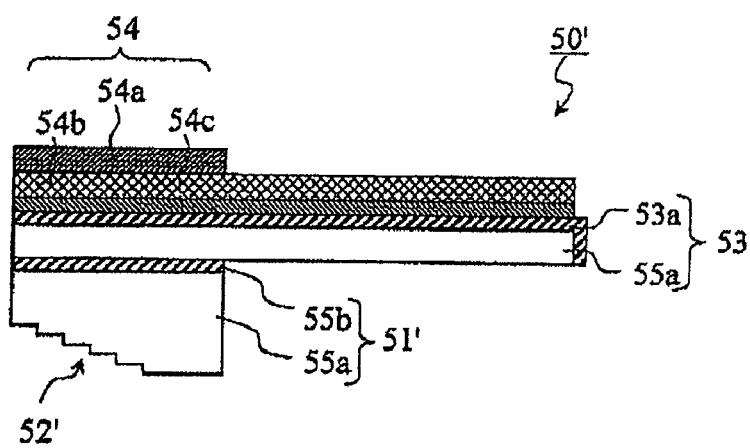
FIG. 9 is a cross-sectional view of a silicon finger contactor in a second embodiment of the present invention.

FIG. 9 is a cross-sectional view of a silicon finger contactor in a second embodiment of the present invention.

The silicon finger contactor 50' in the second embodiment of the present invention is formed with a plurality of the step differences 52' in a staircase shape. Due to this, the support points of the silicon finger contactors 50 mounted on the probe board 40 increase, so the stability of attachment of the silicon finger contactor 50 with respect to the probe board 40 is improved.

Below, one example of the method of production of the probe card 30 according to the present embodiment will be explained.

Figure 30:
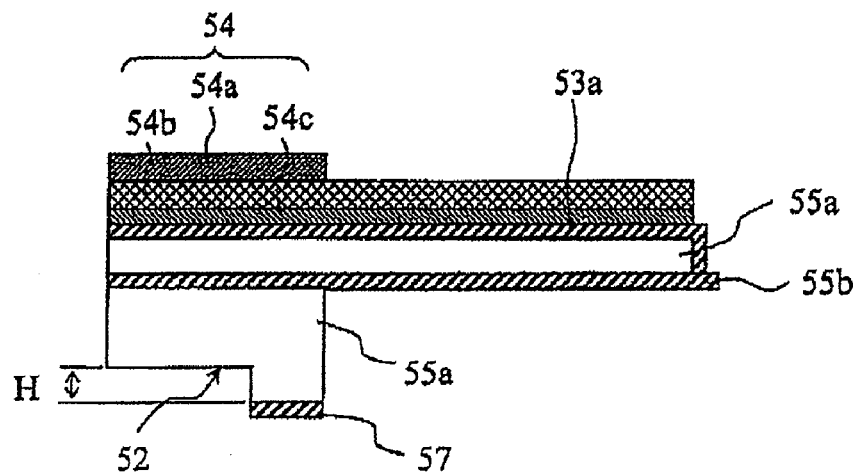
FIG. 30 is a cross-sectional view of a 21st step for producing a silicon finger contactor in the first embodiment of the present invention.
Figure 31A:
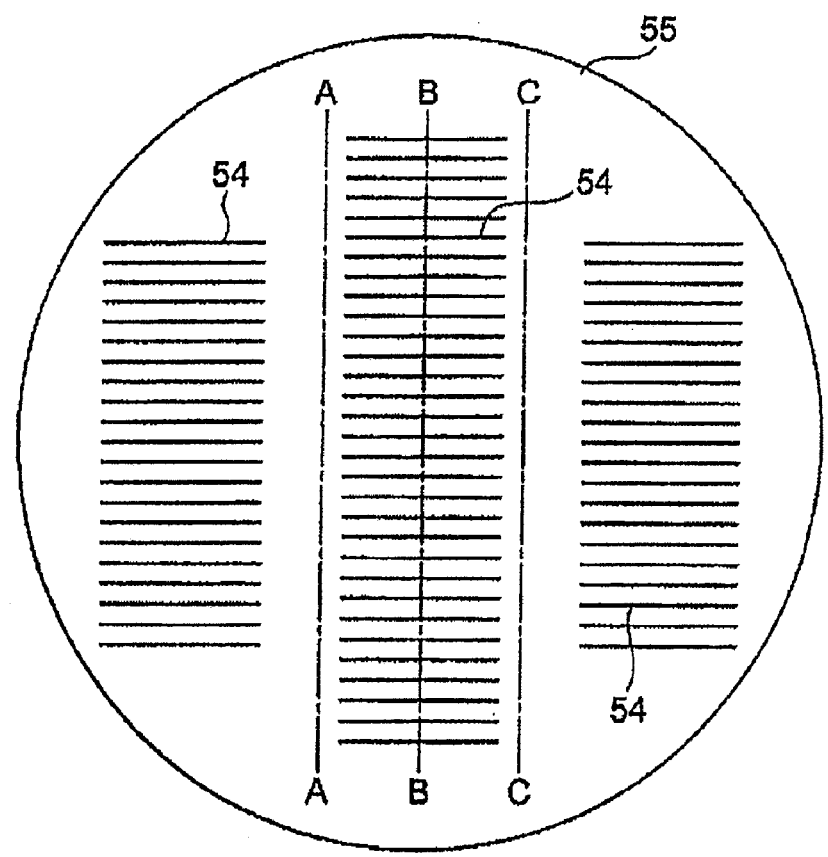
FIG. 31A is a plan view showing a silicon wafer for simultaneously producing a large number of silicon finger contactors in the first embodiment of the present invention and their cutting positions (part 1)
Figure 31B:
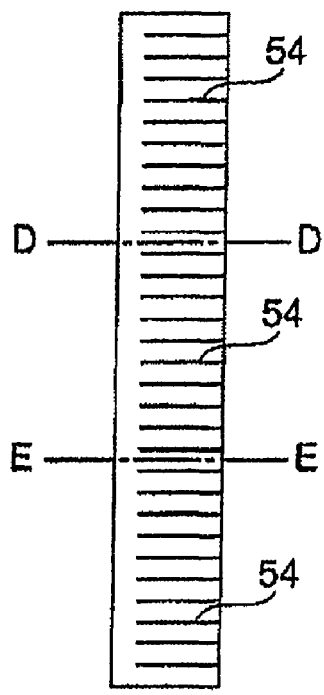
FIG. 31B is a plan view showing a silicon wafer for simultaneously producing a large number of silicon finger contactors in the first embodiment of the present invention and their cutting positions (part 2)
Figure 31C:
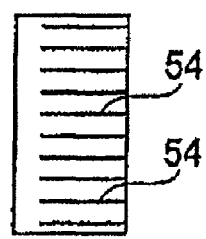
FIG. 31C is a plan view showing a silicon wafer for simultaneously producing a large number of silicon finger contactors in the first embodiment of the present invention and their cutting positions (part 3)

FIG. 10 to FIG. 30 are views of steps for producing a silicon finger contactor in the first embodiment of the present invention, while FIG. 31A to FIG. 31C are plan views showing a silicon wafer for simultaneously producing a large number of silicon finger contactors in the first embodiment of the present invention and their cutting positions.

In the present embodiment, photolithography or other semiconductor production technology is used to form a large number of pairs of silicon finger contactors 50 on a silicon substrate 55, then the pairs of contactors 50 are separated.

Figure 10:
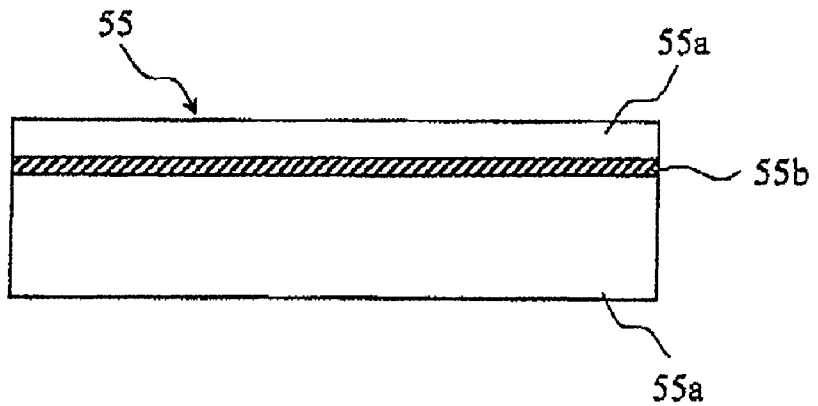
FIG. 10 is a cross-sectional view of a first step for producing a silicon finger contactor in the first embodiment of the present invention.

In the method of production according to the present embodiment, in the first step shown in FIG. 10, first, an SOI wafer 55 is prepared. This SOI wafer 55 is a two-layer SOI wafer having two Si layers 55a at the top and bottom and one SiO₂ (silicon dioxide) layer 55b sandwiched between the two Si layers 55a. The SiO₂ layer 55b of this SOI wafer 55 functions as an etching stopper when forming the support parts 53.

Figure 11:
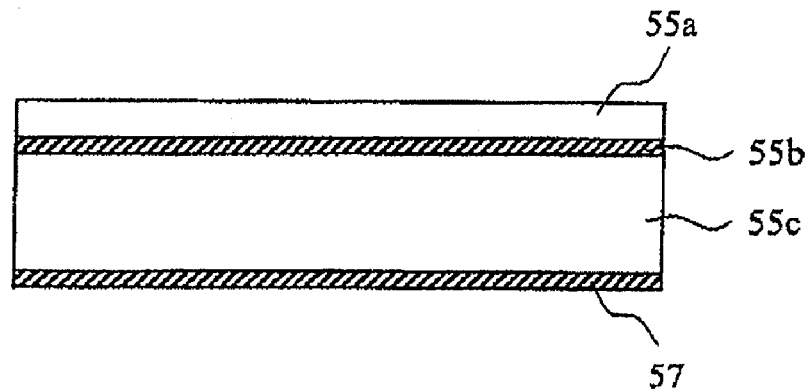
FIG. 11 is a cross-sectional view of a second step for producing a silicon finger contactor in the first embodiment of the present invention.

Next, in the second step shown in FIG. 11, a SiO₂ (silicon dioxide) layer 57 is formed on the bottom surface of the SOI wafer 55. This SiO₂ layer 57 functions for forming the etching mask patterns when forming the step differences 52 at the base parts 51.

Figure 12:
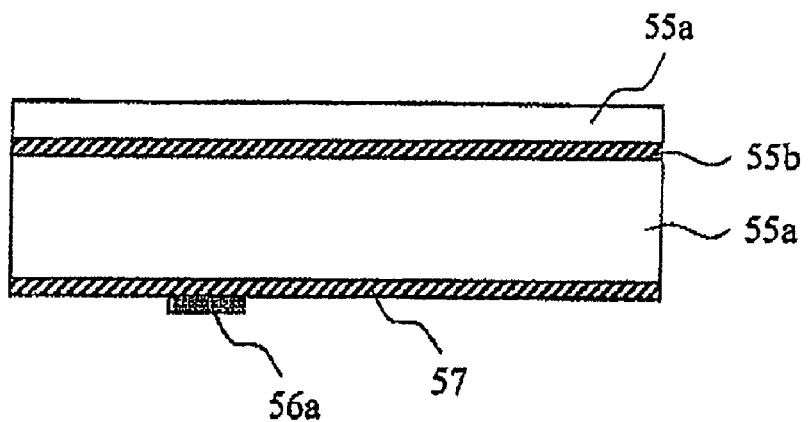
FIG. 12 is a cross-sectional view of a third step for producing a silicon finger contactor in the first embodiment of the present invention.

Next, in the third step shown in FIG. 12, the SiO₂ layer 57 is formed with a resist layer 56a. In this step, while not particularly illustrated, first the SiO₂ layer 57 is formed with a photoresist film, then this photoresist film is overlaid with a photomask and is exposed by ultraviolet light and cured, whereby parts of the SiO₂ layer 57 are formed with a resist layer 56a. Note that the parts of the photoresist film not exposed by ultraviolet light are dissolved and washed away from the SiO₂ layer 57. This resist layer 56a is used in the next fourth step as the etching mask patterns.

Figure 13:
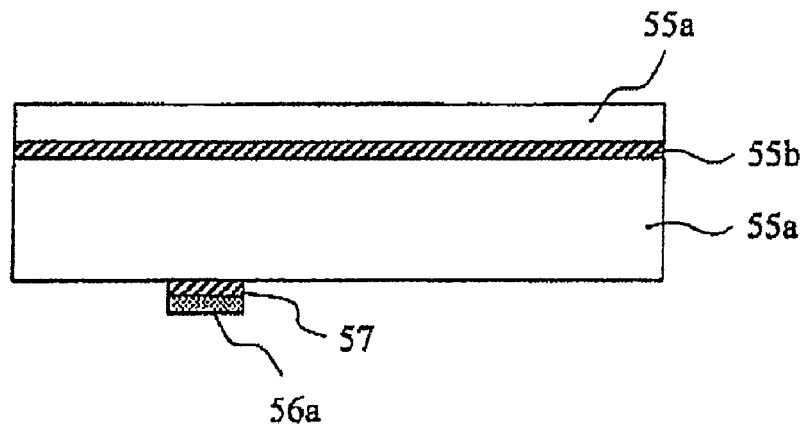
FIG. 13 is a cross-sectional view of a fourth step for producing a silicon finger contactor in the first embodiment of the present invention.
Figure 14:
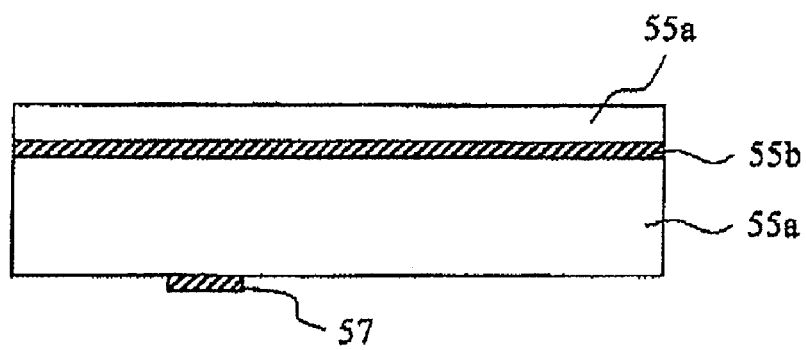
FIG. 14 is a cross-sectional view of a fifth step for producing a silicon finger contactor in the first embodiment of the present invention.

Next, in the fourth step shown in FIG. 13, the SiO₂ layer 57 formed on the bottom of the SOI wafer 55 is etched using, for example, reactive ion etching (RIE) etc. After this etching is completed, at the fifth step shown in FIG. 14, the resist layer 56a is removed.

Figure 15A:
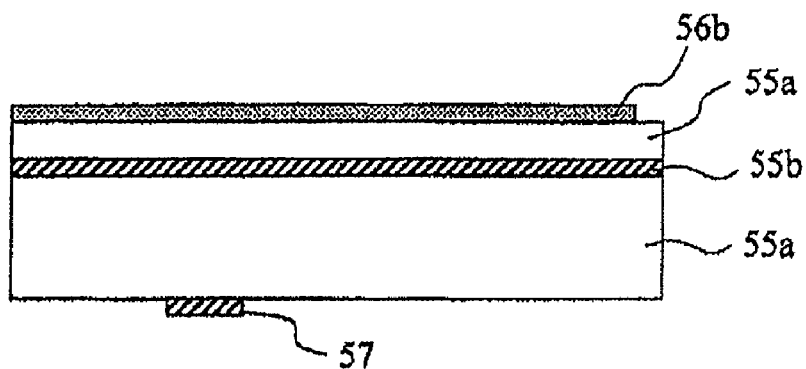
FIG. 15A is a cross-sectional view of a sixth step for producing a silicon finger contactor in the first embodiment of the present invention.
Figure 15B:
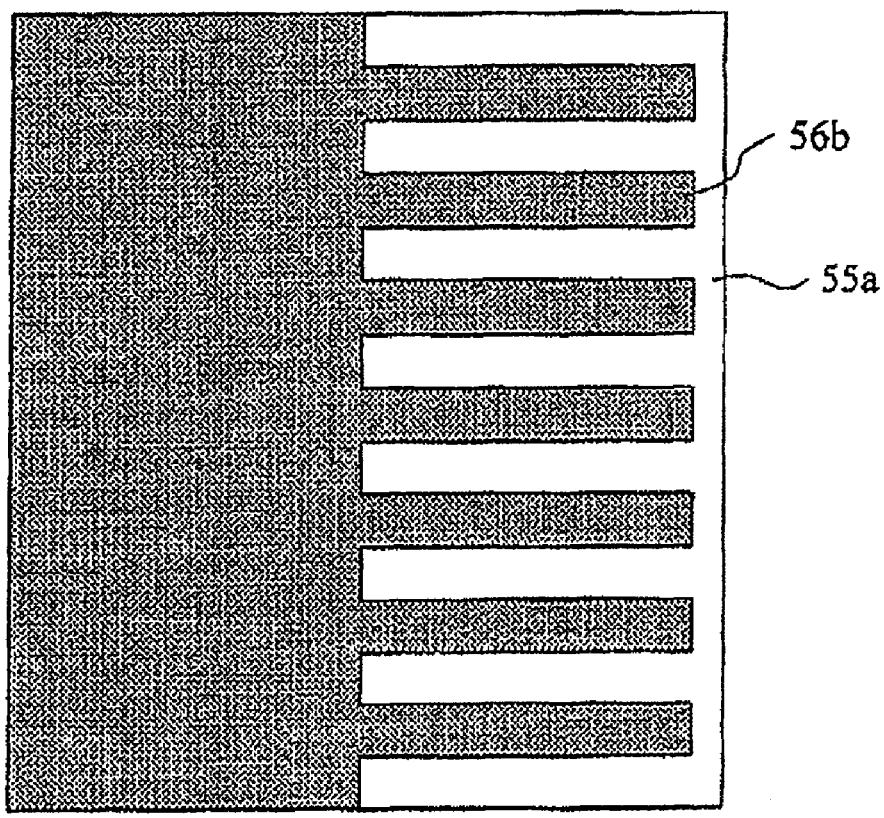
FIG. 15B is a plan view of a sixth step for producing a silicon finger contactor in the first embodiment of the present invention.

Next, in the sixth step shown in FIG. 15A, the SOT wafer 55 is formed on its top surface with a resist layer 56b. This resist layer 56b is processed by the same procedure as the above-mentioned third step, as shown in FIG. 15B, to form finger shapes (a comb shape) on the top surface of the SOI wafer 55.

Figure 16:
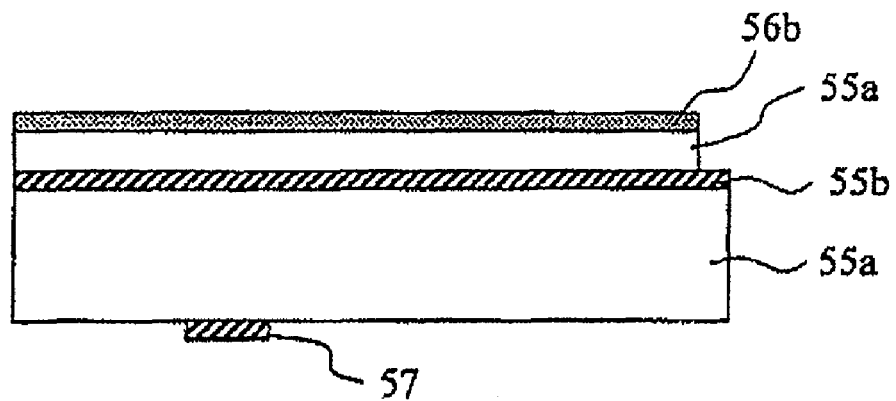
FIG. 16 is a cross-sectional view of a seventh step for producing a silicon finger contactor in the first embodiment of the present invention.
Figure 17:
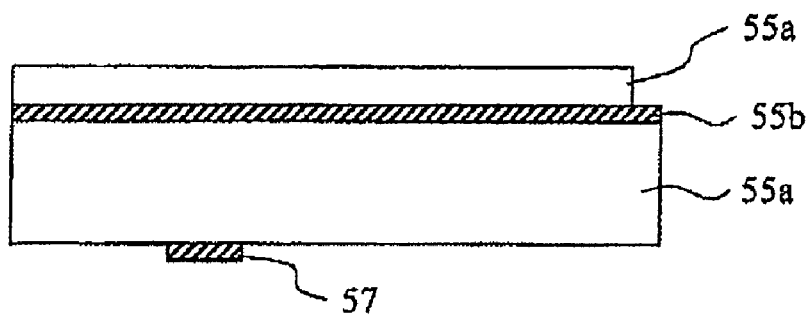
FIG. 17 is a cross-sectional view of an eighth step for producing a silicon finger contactor in the first embodiment of the present invention.

Next, in the seventh step shown in FIG. 16, the upper Si layer 55a of the SOI wafer 55 is etched. As this etching technique, the DRIE method may be mentioned. This etching is used to form the upper Si layer 55a of the SOI wafer 55 into finger shapes (a comb shape). At this time, the SiO₂ layer 55b of the SOI wafer 55 functions as an etching stopper. After this etching is completed, in the eighth step shown in FIG. 17, the resist layer 56b is removed.

Figure 18:
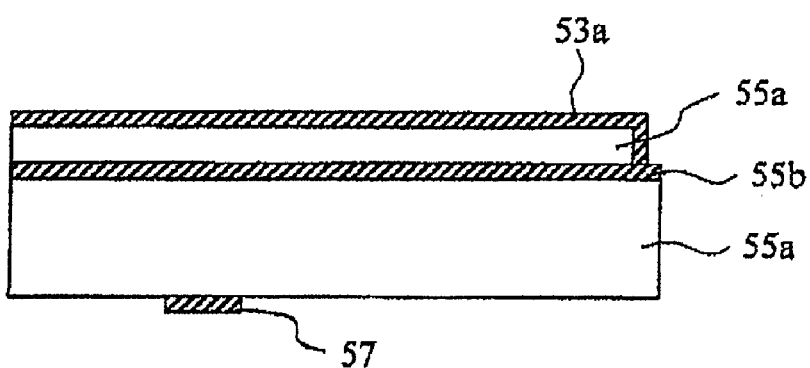
FIG. 18 is a cross-sectional view of a ninth step for producing a silicon finger contactor in the first embodiment of the present invention.

Next, in the ninth step shown in FIG. 18, the top surface of the SOI wafer 55 is formed with an SiO₂ layer 53a. This SiO₂ layer 53a functions as an insulation layer of the support parts 53.

Figure 19:
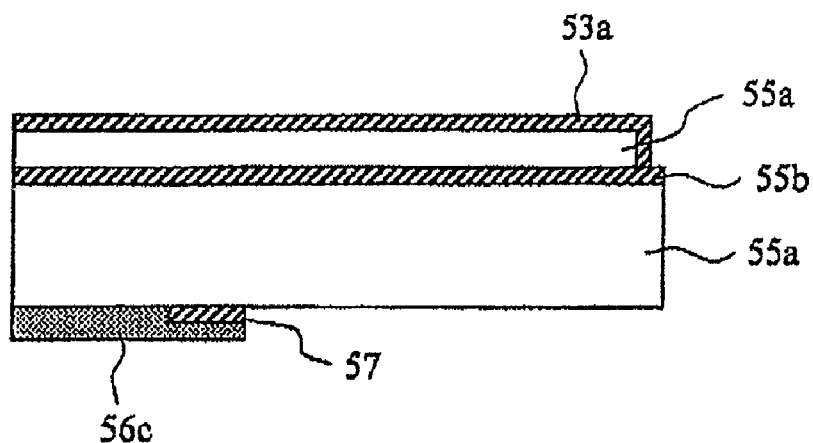
FIG. 19 is a cross-sectional view of a 10th step for producing a silicon finger contactor in the first embodiment of the present invention.

Next, in the 10th step shown in FIG. 19, the same procedure as the above-mentioned third step is used to form a resist layer 56c on part of the bottom surface of the SOI wafer 55 and on the SiO₂ layer 57.

Figure 20:
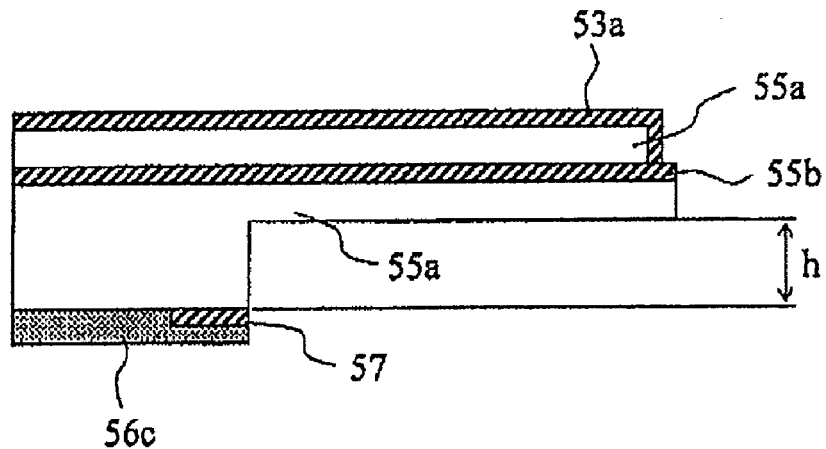
FIG. 20 is a cross-sectional view of an 11th step for producing a silicon finger contactor in the first embodiment of the present invention.
Figure 21:
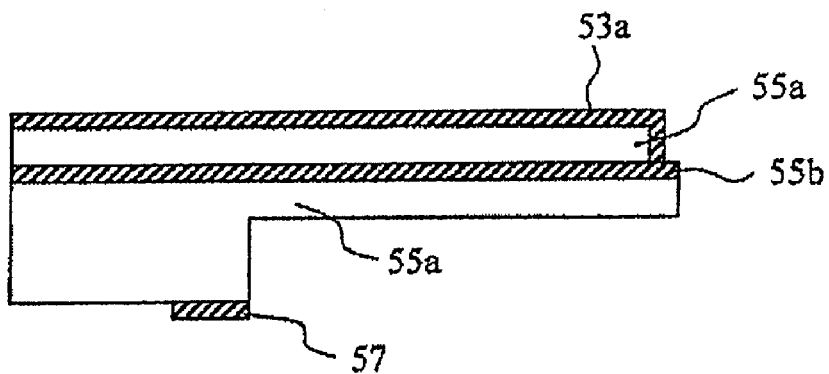
FIG. 21 is a cross-sectional view of a 12th step for producing a silicon finger contactor in the first embodiment of the present invention.

Next, in the 11th step shown in FIG. 20, the Si layer 55a at the bottom of the SOI wafer 55 is etched. As a specific technique of this etching, the DRIE similar to the seventh step may be mentioned. Due to this etching, the bottom Si layer 55a is removed to exactly a depth h. This depth h is set by controlling the etching time in the DRIE. When this etching is completed, in the 12th step shown in FIG. 21, the resist layer 56c removed.

Figure 22:
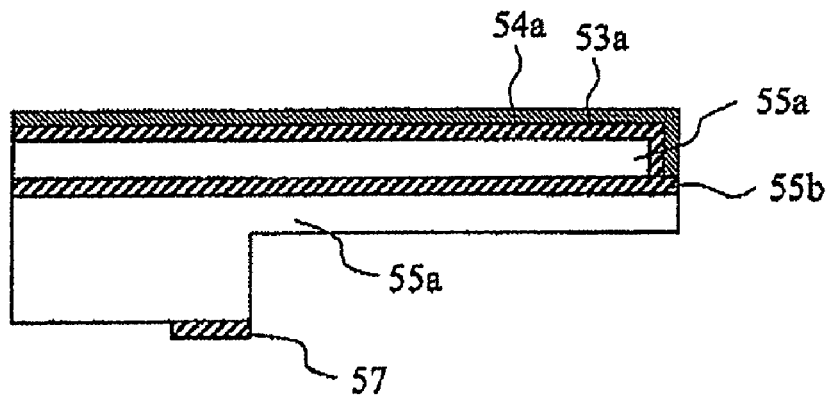
FIG. 22 is a cross-sectional view of a 13th step for producing a silicon finger contactor in the first embodiment of the present invention.

Next, in the 13th step shown in FIG. 22, the SiO₂ layer 53a formed on the top surface of the SOI wafer 55 is formed above it with a seed layer 54a made of gold and titanium. As the technique for forming this seed layer 54a, vacuum deposition, sputtering, vapor deposition, etc. may be mentioned.

Figure 23:
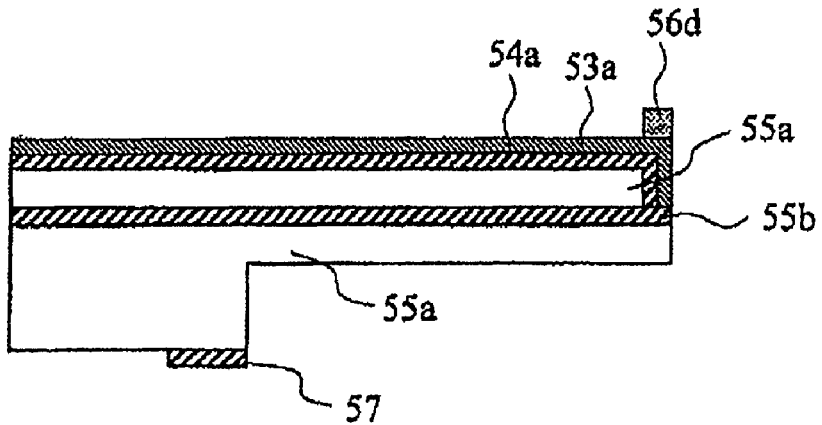
FIG. 23 is a cross-sectional view of a 14th step for producing a silicon finger contactor in the first embodiment of the present invention.

Next, in the 14th step shown in FIG. 23, the same procedure as the above-mentioned third step is used to form a resist layer 56d on part of the seed layer 54a.

Figure 24:
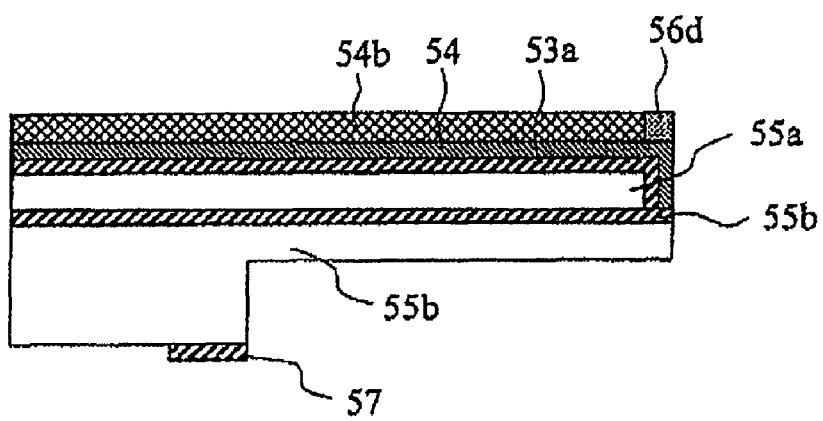
FIG. 24 is a cross-sectional view of a 15th step for producing a silicon finger contactor in the first embodiment of the present invention.
Figure 25:
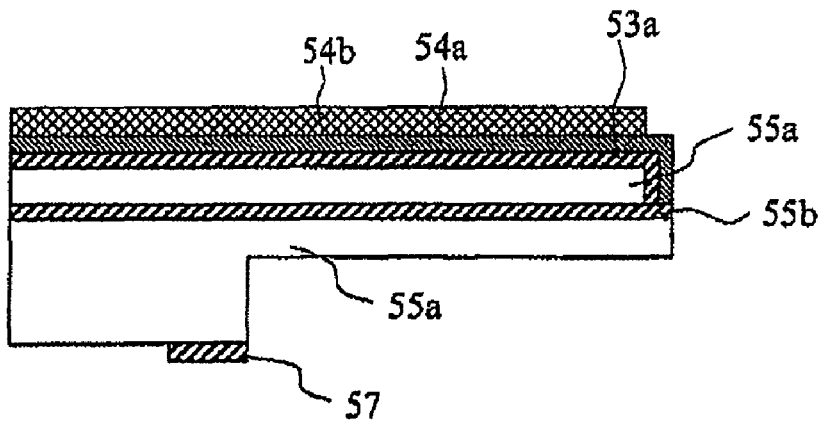
FIG. 25 is a cross-sectional view of a 16th step for producing a silicon finger contactor in the first embodiment of the present invention.

Next, in the 15th step shown in FIG. 24, the seed layer 54a is plated with nickel cobalt to form a nickel cobalt film 54b. After this plating is completed, the resist layer 56d is removed in the 16th step shown in FIG. 25.

Figure 26:
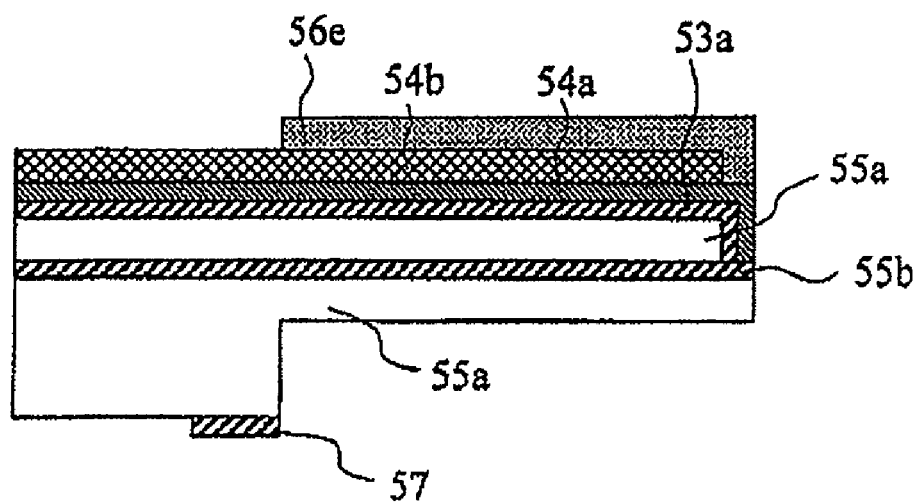
FIG. 26 is a cross-sectional view of a 17th step for producing a silicon finger contactor in the first embodiment of the present invention.

Next, in the 17th step shown in FIG. 26, the same procedure as the above-mentioned third step is used to form a resist layer 56e on part of the nickel cobalt film 54b.

Figure 27:
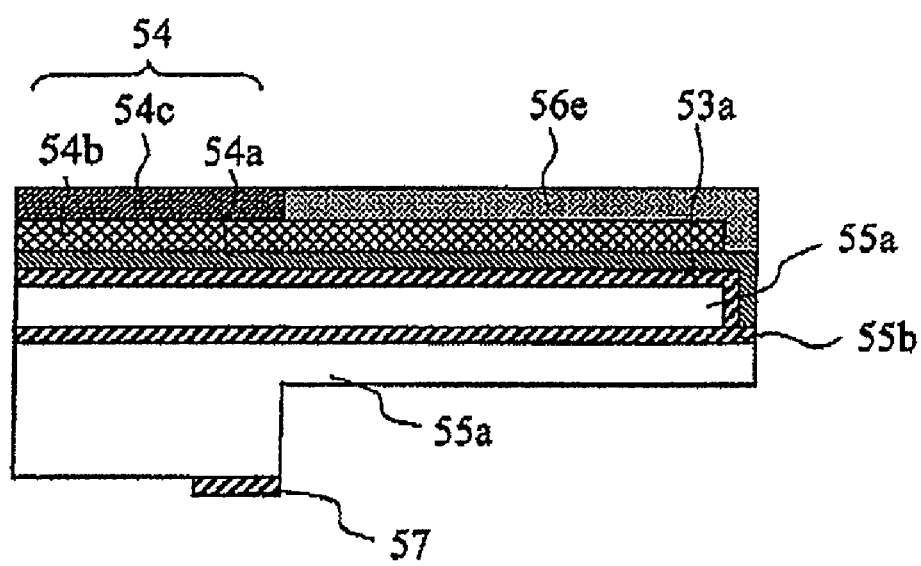
FIG. 27 is a cross-sectional view of a 18th step for producing a silicon finger contactor in the first embodiment of the present invention.
Figure 28:
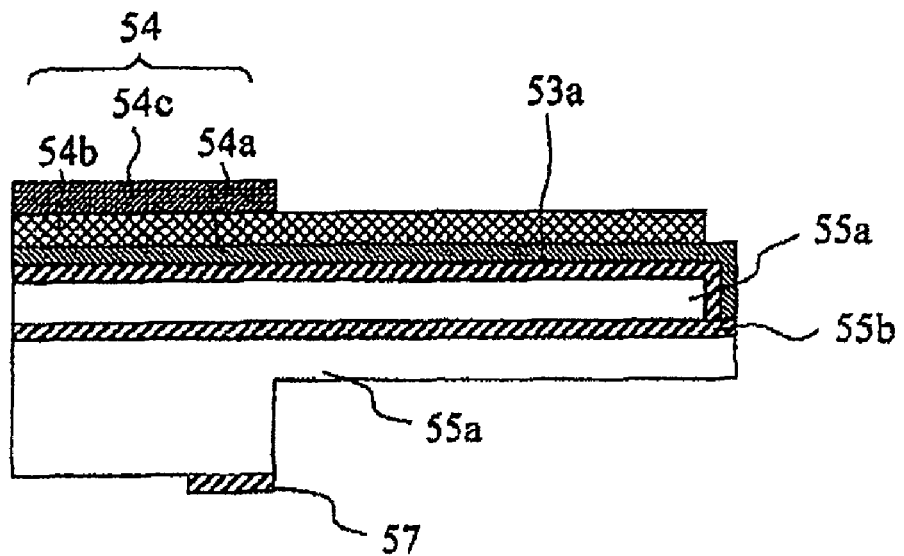
FIG. 28 is a cross-sectional view of a 19th step for producing a silicon finger contactor in the first embodiment of the present invention.

Next, in the 18th step shown in FIG. 27, the nickel cobalt film 54b is plated with gold to form a gold plating film 54c. After this plating is completed, the resist layer 56e is removed in the 19th step shown in FIG. 28.

Figure 29:
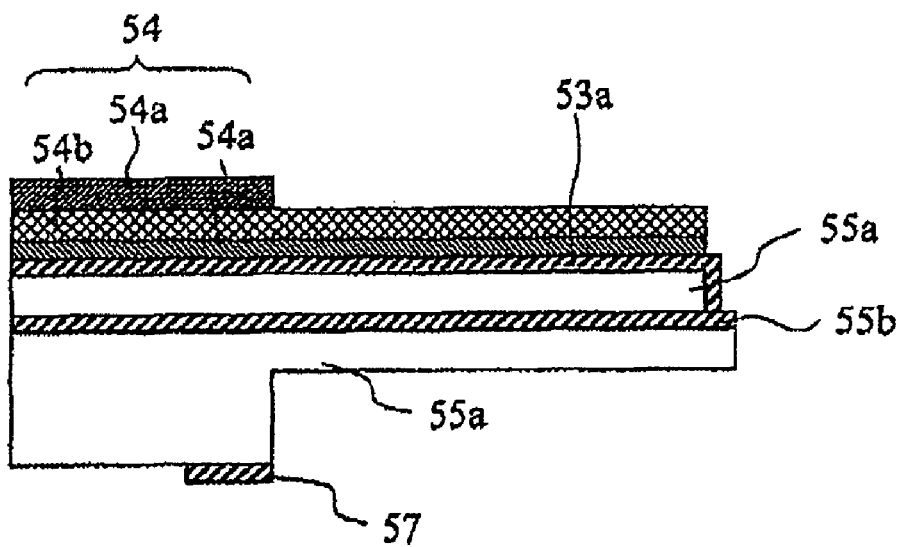
FIG. 29 is a cross-sectional view of a 20th step for producing a silicon finger contactor in the first embodiment of the present invention.

Next, in the 20th step shown in FIG. 29, the front end part of the seed layer 43a is removed, then in the 21st step shown in FIG. 30, the bottom Si layer 55a of the SOI wafer 55 is etched. As a specific method of this etching, the DRIE method similar to the seventh step may be mentioned. At this time, the SiO₂ layer 57 formed at the bottom surface of the SOI wafer 55 and the SiO₂ layer 55b of the SOI wafer 55 function as etching stoppers. This etching further removes the bottom Si layer 55a by exactly the depth H to form the step difference 52 of the base part 51. This depth H is set by controlling the etching time in DRIE.

Next, in the 22nd step, the SiO₂ layer 57 formed on the bottom surface of the SOI wafer 55 and the SiO₂ layer 55b of the SOI wafer 55 are removed by dry etching, whereby the silicon finger contactors 50 such as shown in FIG. 6 are completed. At this time, due to the removal of the SiO₂ layer 55b of the SOI wafer 55, a space is formed between the support parts 53.

Next, the SOI wafer 55 on which the silicon finger contactors 50 are produced is cut by dicing for example along the line A-A, line B-B, and line C-C shown in FIG. 31A. That cut SOI wafer 55 is, as shown in FIG. 31B, further cut as needed for each group of silicon finger contactors 50. That is, as shown in FIG. 31C, as shown in FIG. 31B, the SOI wafer 55 is further cut along the line D-D and the line E-E so that a predetermined number of silicon finger contactors 50 is provided for each group.

Next, predetermined positions of the probe board 40 are coated with an adhesive, the thus produced silicon finger contactors 50 are placed at the predetermined positions, and the silicon finger contactors 50 are bonded to the probe board 40. At this time, the silicon finger contactors 50 are placed on the probe board 40 so that the angle parts 52a, 52b of the step differences 52 formed at the base parts 51 contact the surface of the probe board 40. Due to this, the silicon finger contactors 50 are attached to the probe board 40 at an inclination angle β according to the ratio of the depth H and length L of the step differences 52.

Further, the connection traces 41a provided at the probe board 40 and the conductive parts 54 of the silicon finger contactors 50 are connected by bonding wires 41b to complete the probe card 30 according to the present embodiment.

Figure 32:
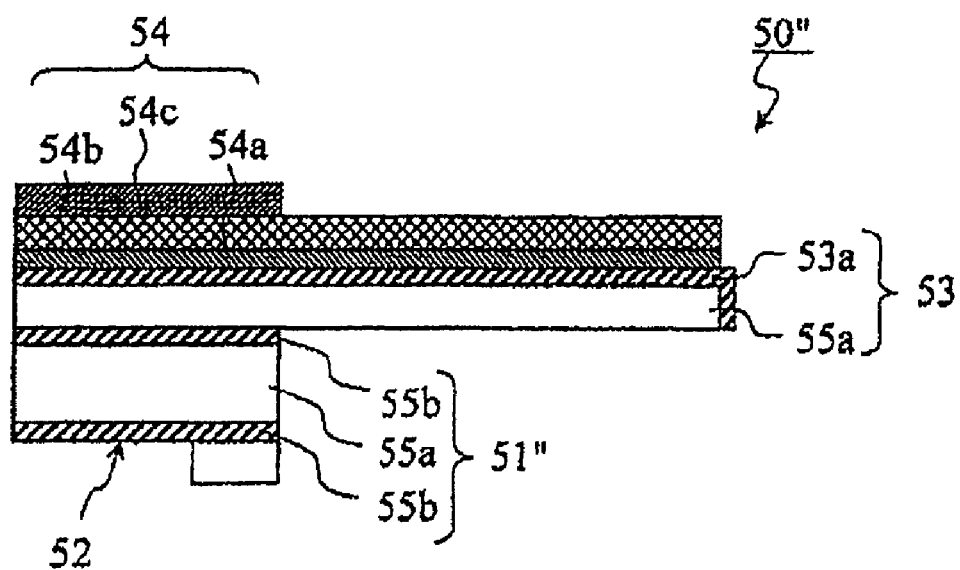
FIG. 32 is a cross-sectional view of a silicon finger contactor in the third embodiment of the present invention.

FIG. 32 is a cross-sectional view of a silicon finger contactor in the third embodiment of the present invention.

The silicon finger contactor 50" of the third embodiment of the present invention is basically comprised of a three-layer SOI wafer having three Si layers 55a and two SiO$_2$ layers 55b sandwiched between the three Si layers.

In the present embodiment, when forming the step difference 52 of the base part 51", instead of controlling the etching time, it is possible to use the bottom SiO$_2$ layer 55b of the SOI wafer as an etching stopper to set the depth H of the step difference 52 to a high precision.

Note that in the present embodiment, in the etching of the Si layer 55a from the bottom surface of the SOI wafer for forming the support parts 53, the bottom SiO$_2$ layer 55b of the SOI wafer must be removed.

Below, a production apparatus for a probe card according to an embodiment of the present invention will be explained.

Figure 33:
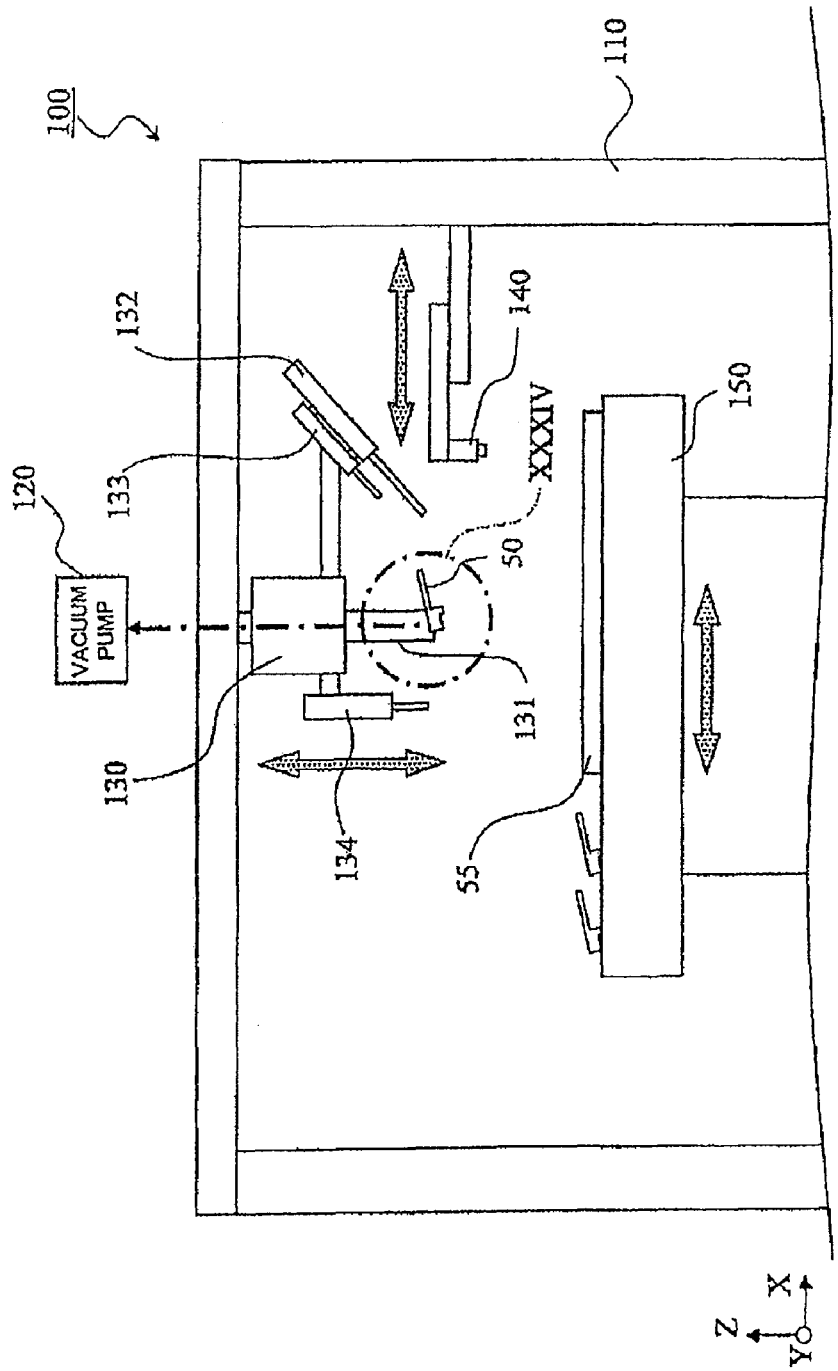
FIG. 33 is a schematic view of the overall configuration of a production apparatus for a probe card according to an embodiment of the present invention.
Figure 34:
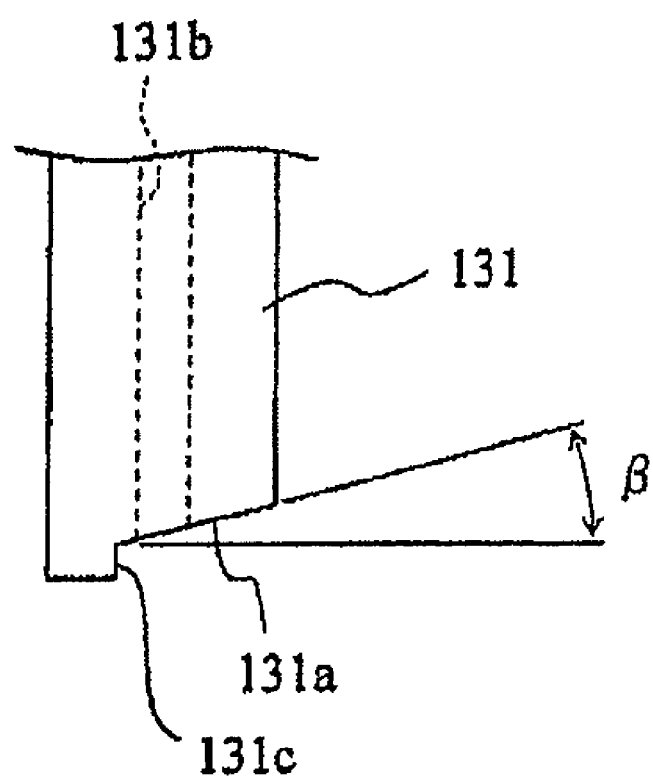
FIG. 34 is an enlarged view of the part XXXIV of FIG. 33 in the state not holding a silicon finger contactor.
Figure 35:
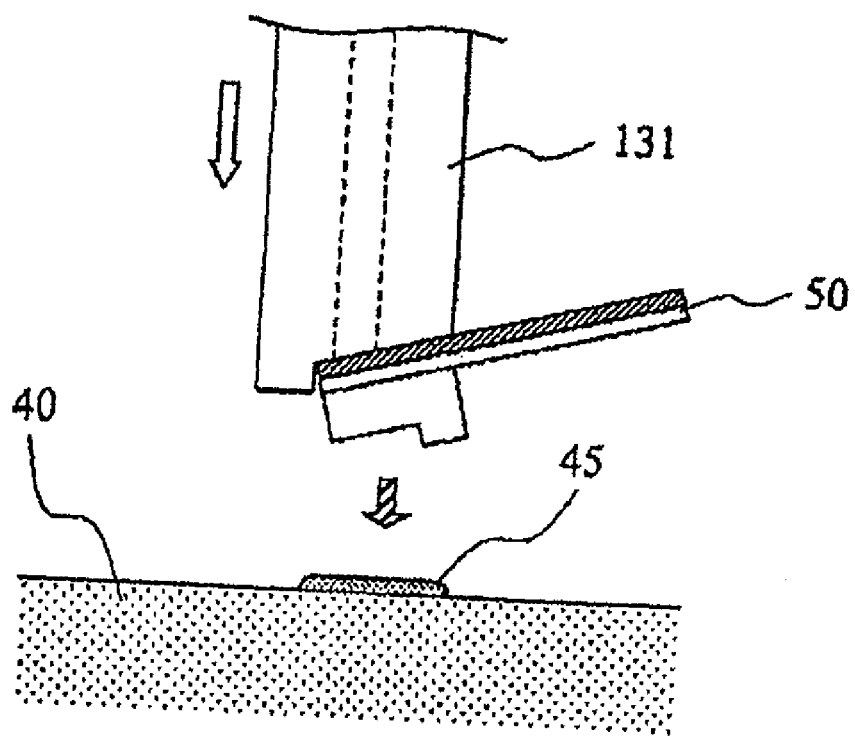
FIG. 35 is an enlarged view of the part XXXIV of FIG. 33 in the state holding a silicon finger contactor.

FIG. 33 is a schematic view of the overall configuration of a production apparatus for a probe card according to an embodiment of the present invention; FIG. 34 is an enlarged view of the part XXXIV of FIG. 33 in the state not holding a silicon finger contactor; and FIG. 35 is an enlarged view of the part XXXIV of FIG. 33 in the state holding a silicon finger contactor.

The probe card production apparatus 100 according to an embodiment of the present invention is a apparatus for mounting silicon finger contactors 50 produced by the abovementioned FIG. 10 to FIG. 31C on a probe board 40.

This probe card production apparatus 100, as shown in FIG. 33, is provided with a suction unit 131 for holding a silicon finger contactor 50 by suction, a coating unit 132 for coating a predetermined position on the probe board 40 with a adhesive 45, a measurement unit 134 for measuring the relative height of a silicon finger contactor 50 with respect to the probe board 40, a camera unit 140 for recognizing the position or posture of the probe board 40 and silicon finger contactor 50, and a movement stage 150 for making the probe board 40 move relative to the silicon finger contactor 50.

The suction unit 131 has at its front end a suction surface 131a for contacting and sucking on the top surface of a silicon finger contactor 50. This suction surface 131a, as shown in FIG. 34, is formed by an inclined surface having an angle substantially the same as the angle β of attachment of the silicon finger contactor 50 to the probe board 40.

This suction surface 131a has opened at it one end of a passage 131b passing through the suction unit 131. The other end of this passage 131b, as shown in FIG. 33, is communicated with a vacuum pump 120.

Further, in the present embodiment, the suction surface 131a, as shown in FIG. 34 and FIG. 35, is formed with a step difference 131c with which the rear end of the silicon finger contactor 50 engages.

Due to this, the silicon finger contactor 50 held by the suction unit 131 can be restricted from fine movement with respect to the suction surface 131a. As a result, the silicon finger contactor 50 can be positioned and bonded to a predetermined position on the probe board 40 with a high precision, so mistaken contact at the time of the test can be prevented.

As opposed to this, when one suction surface 131a is not formed with the step difference 131c, the surface tension of the adhesive 45 acts against the suction force of the suction unit 131, the silicon finger contactor 50 slides along the suction surface 131a, and the silicon finger contactor 50 is liable to be bonded to the probe board 40 in the state deviated from its predetermined position.

Returning to FIG. 33, the coating unit 132 is a syringe for ejecting an ultraviolet curing type adhesive on the probe board 40. This coating unit 132 is provided with an ultraviolet emission unit 133 for curing the adhesive 45 coated on the probe board 40.

The measurement unit 134 has, for example, a noncontact type distance measurement sensor using a laser etc. The distance measurement sensor can measure the distance between a silicon finger unit 50 held by the suction unit 131 and the probe board 40, that is, the height of the silicon finger unit 50 with respect to the probe board 40.

The suction unit 131, coating unit 132, and measurement unit 134 are attached to an elevation head 130. This elevation head 130 is supported by a frame 110 provided surrounding the movement stage 150 on which the probe board 40 is held and is designed to be able to move in the Z-axis direction with respect to the movement stage 150.

The camera unit 140 has, for example, a CCD camera provided so as to be able to capture images below it. This camera unit 40 is attached to the frame 110 independently of the elevation head 130 and can move in the XY-direction.

The movement stage 150 has a chuck (not shown) able to hold the probe board 40 and can make that probe board 40 move in the X-axis direction and Y-axis direction and can make the probe board 40 rotate about the Z-axis in the θ direction.

In the above configured probe card production apparatus 100, the probe card 30 is produced as follows.

First, the camera unit 140 captures an image of the probe board 40 held on the movement stage 150 and recognizes the relative position of the probe board 40 with respect to the elevation head 130. Further, the movement stage 150 moves so that a predetermined position of the probe board 40 faces a discharge port of the coating unit 132, then the elevation head 130 descends in the Z-axis direction.

The coating unit 132 coats the adhesive 45 at a predetermined position on the probe board 40, then the camera unit 140 captures an image of the silicon finger contactor 50 held by the suction head 131 and the position and posture of the silicon finger contactor 50 are recognized.

Next, the movement stage 150 is moved so that the silicon finger contactor 50 held by the suction unit 131 is positioned above a predetermined position of the probe board 40, then the elevation head 130 descends in the Z-axis direction.

At the time of this descent, the measurement unit 134 measures the height of the silicon finger unit 50 with respect to the probe board 40. Further, when the height of the silicon finger contactor 50 with respect to the probe board 40 becomes zero, the measurement unit 134 stops the descent of the elevation head 130 in the Z-axis direction. Due to this, the silicon finger contactor 50 can be prevented from being pushed against the probe board 40. As opposed to this, if the silicon finger contactor 50 is pushed against the probe board 40, that pressing force is liable to cause the silicon finger contactor 50 to slide along the inclination of the suction surface 131a, so the silicon finger contactor 50 is liable to be bonded to the probe board 40 in a state deviated from the predetermined position.

After the silicon finger contactor 50 is placed at a predetermined position on the probe board 40, the movement stage 150 is moved so that the front end of the ultraviolet emission unit 133 faces the predetermined position. Then, the ultraviolet emission unit 133 emits ultraviolet light to cure the adhesive 45 and bond the silicon finger contactor 50 at the predetermined position on the probe board 40.

By repeating the above routine for each of the group of silicon finger contactors 50 shown in FIG. 31C, a large number of silicon finger contactors 50 are mounted on a single probe board 40.

Note that the above embodiments were described to facilitate understanding of the present invention and were not described to limit the present invention. Therefore, the elements disclosed in the above embodiments include all design changes and equivalents falling within the technical scope of the present invention.

What is claimed is:

1. A contactor comprising:
   a base part having three or more steps in a stairway state;
   a support part with a rear end side provided at the base part and a front end side sticking out from the base part; and
   a conductive part formed on a surface of the support part and electrically contacting a contact of a device under test.

2. The contactor as set forth in claim 1, wherein the support part has an insulation layer at the surface on which the conductive part is formed.

3. The contactor as set forth in claim 2, wherein the insulation layer is made of $SiO_2$.

4. A contact structure comprising:
   a plurality of contactors as set forth in claim 1; and
   a contact board, the plurality of contactors being mounting on a surface of the contact board, wherein
   each of the contactors has a plurality of the support parts, and
   the plurality of support parts are arranged on the base part at predetermined intervals.

5. The contact structure as set forth in claim 4, wherein the contactors are bonded to the contact board via one of an ultraviolet curing type adhesive, a temperature curing type adhesive, and a thermoplastic adhesive.

6. The contact structure as set forth in claim 4, wherein
   a plurality of connection traces are provided on the surface of the contact board, and
   the connection traces are electrically connected to corresponding conductive parts of the contactors.

7. The contact structure as set forth in claim 6, wherein the connection traces provided on the contact board and the conductive parts of the contactors are connected by bonding wires.

8. The contact structure as set forth in claim 4, wherein
   devices under test are electrical circuits formed on a semiconductor wafer, and
   the contact board has a heat expansion coefficient ($\alpha1$) satisfying the following equation (1):

$$\alpha1 = \alpha2 \times \Delta t2 / \Delta t1 \qquad \text{equation (1)}$$

where, in the above equation (1), $\alpha1$ is a heat expansion coefficient of the contact board, $\Delta t1$ is a rising temperature of the contact board at the time of a test, $\alpha2$ is a heat expansion coefficient of the semiconductor wafer, and $\Delta t2$ is a rising temperature of the semiconductor wafer at the time of the test.

9. The contact structure as set forth in claim 8, wherein the contact board comprises:
   a core part having a core insulation layer containing a carbon fiber material;
   at least one first multilayer interconnect part having a first insulation layer containing a glass cloth and first interconnect patterns and laminated on the core part; and
   at least one second multilayer interconnect part having a second insulation layer and second interconnect patterns and laminated on the first multilayer interconnect part.

10. The contact structure as set forth in claim 9, wherein the second multilayer interconnect part is a built-up layer.

11. A probe card having a contact structure as set forth in claim 4.

* * * * *